(12) United States Patent
Jang

(10) Patent No.: US 11,145,706 B2
(45) Date of Patent: Oct. 12, 2021

(54) DISPLAY DEVICE AND METHOD OF MANUFACTURING THE SAME

(71) Applicant: Samsung Display Co., LTD., Yongin-si (KR)

(72) Inventor: Joo-Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/790,354

(22) Filed: Feb. 13, 2020

(65) Prior Publication Data

US 2020/0403054 A1 Dec. 24, 2020

(30) Foreign Application Priority Data

Jun. 21, 2019 (KR) .................. 10-2019-0074461

(51) Int. Cl.
*H01L 27/32* (2006.01)
*H01L 23/00* (2006.01)

(52) U.S. Cl.
CPC .......... *H01L 27/3276* (2013.01); *H01L 24/29* (2013.01); *H01L 24/83* (2013.01); *H01L 2224/29239* (2013.01); *H01L 2224/29244* (2013.01); *H01L 2224/29247* (2013.01); *H01L 2224/29255* (2013.01);
(Continued)

(58) Field of Classification Search
CPC ..... H01L 27/3276; H01L 24/83; H01L 24/29; H01L 2224/29239; H01L 2224/83851; H01L 2224/29257; H01L 2224/29244; H01L 2224/29247; H01L 2224/83862; H01L 2224/29255; H01L 2227/323; H01L 2924/12044

USPC .............. 257/40, 72, 91, 690, 778, E23.023, 257/E33.053, E33.065; 349/139, 149,
(Continued)

(56) References Cited

U.S. PATENT DOCUMENTS 10,483,434 B2 * 11/2019 Liu .................. H01L 33/62
2006/0244741 A1 * 11/2006 Kimura ............ G02F 1/133514
345/204
(Continued)

FOREIGN PATENT DOCUMENTS

JP 2000-183470 6/2000
JP 2005-129757 5/2005
(Continued)

*Primary Examiner* — Dao H Nguyen
(74) *Attorney, Agent, or Firm* — H.C. Park & Associates, PLC

(57) ABSTRACT

A display device including a lower substrate having a display area and a pad area, a display structure disposed in the display area of the lower substrate, an upper substrate disposed on the display structure in the display area, and facing the lower substrate, pad electrodes disposed in the pad area of the lower substrate and spaced apart from each other in a first direction parallel to a top surface of the lower substrate, a conductive film member including conductive balls disposed on the pad electrodes and having a first area overlapping the pad electrodes and a second area not overlapping the pad electrodes, and a film package disposed on the conductive film member and including bump electrodes overlapping the first area of the conductive film member, in which the shape of the conductive balls disposed in the first area is different from those disposed in the second area.

11 Claims, 21 Drawing Sheets

(52) U.S. Cl.
CPC ............... *H01L 2224/29257* (2013.01); *H01L 2224/83851* (2013.01); *H01L 2224/83862* (2013.01); *H01L 2227/323* (2013.01); *H01L 2924/12044* (2013.01)

(58) Field of Classification Search
USPC .......... 349/150; 361/767, 749; 438/118, 119, 438/125, 26
See application file for complete search history.

(56) References Cited

U.S. PATENT DOCUMENTS

| | | | | |
|---|---|---|---|---|
| 2009/0039495 | A1* | 2/2009 | Yamashita | H01L 24/28 257/690 |
| 2011/0079799 | A1* | 4/2011 | Lee | C09J 9/02 257/91 |
| 2016/0056222 | A1* | 2/2016 | Odaka | H05K 1/117 257/72 |
| 2017/0338198 | A1 | 11/2017 | Jang et al. | |
| 2018/0006004 | A1 | 1/2018 | Namkung et al. | |

FOREIGN PATENT DOCUMENTS

| | | |
|---|---|---|
| KR | 10-2017-0130003 | 11/2017 |
| KR | 10-2018-0003716 | 1/2018 |

\* cited by examiner

FIG. 21
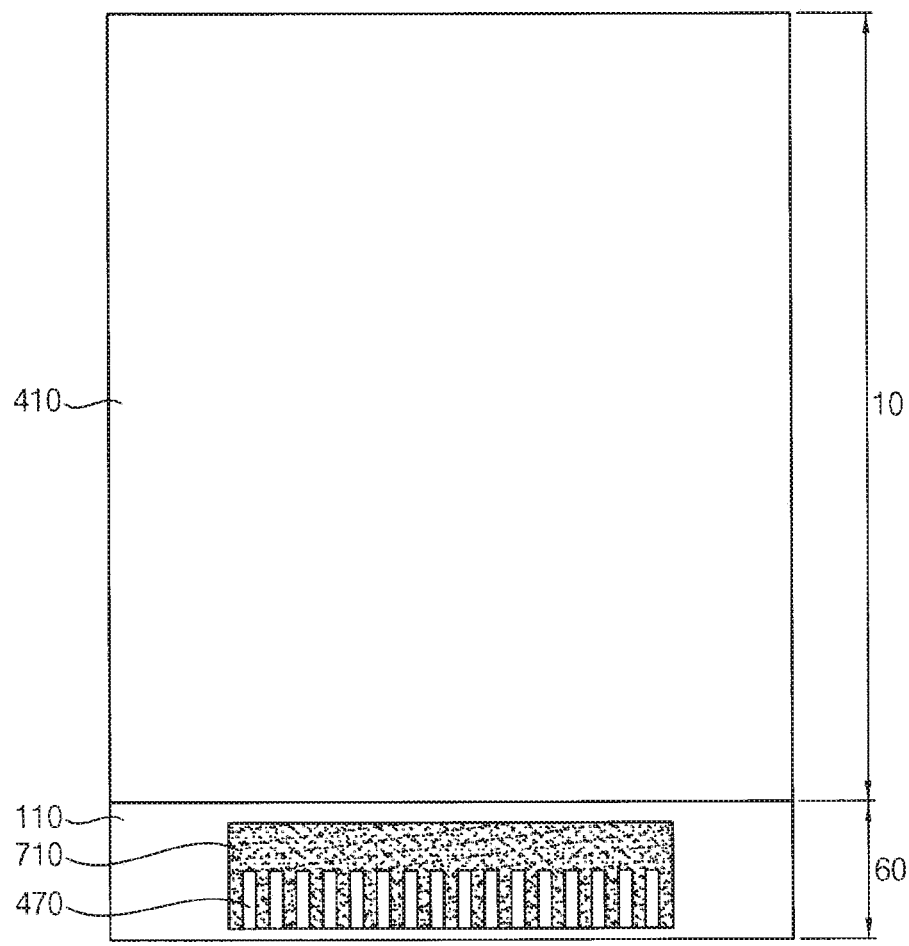
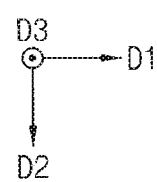

DISPLAY DEVICE AND METHOD OF MANUFACTURING THE SAME

CROSS-REFERENCE TO RELATED APPLICATION

This application claims priority from and the benefit of Korean Patent Application No. 10-2019-0074461 filed on Jun. 21, 2019, which is hereby incorporated by reference for all purposes as if fully set forth herein.

BACKGROUND

Field

Exemplary embodiments of the invention relate generally to a display device and a method of manufacturing a display device, and more specifically, a display device including a conductive film member and a method of manufacturing the same.

Description of the Background

Flat panel display devices are used as display devices, and have been replacing cathode ray tube display devices due to lightweight and thin characteristics thereof. Flat panel display devices typically include liquid crystal display devices and organic light emitting diode display devices.

A display device may include an upper substrate and a lower substrate, and a plurality of pad electrodes connected to an external device may be disposed on the lower substrate. For example, as the size of the display device increases and the resolution of the display device increases, the number of signals input to the display device may be increased. As such, the display device may include a relatively large number of pad electrodes to receive the signals from the external device. In order to arrange the relatively large number of pad electrodes in a limited space, an interval between the pad electrodes may become relatively narrow.

In order for the pad electrodes to be electrically connected to the external device, the display device may further include an anisotropic conductive film and a flexible printed circuit board, which are disposed on the pad electrodes. The anisotropic conductive film may include conductive balls and a resin layer covering the conductive balls, and has a relatively thick thickness. The flexible printed circuit board may include bump electrodes overlapping the pad electrodes. The anisotropic conductive film may have a configuration, in which the conductive balls are irregularly arranged in one layer, or in which the conductive balls overlap each other in a plurality of layers in a depth direction. In addition, in a process of curing the anisotropic film, when the flexible printed circuit board applies a pressure to the anisotropic conductive film in the depth direction, a relatively large amount of the resin layer may be reflowed due to the relatively thick resin layer. In this case, the density of the conductive balls may become less uniform, which may cause adjacent pad electrodes or adjacent bump electrodes to be short-circuited by the conductive balls.

The above information disclosed in this Background section is only for understanding of the background of the inventive concepts, and, therefore, it may contain information that does not constitute prior art.

SUMMARY

Display devices constructed according to exemplary embodiments of the invention and a method of manufacturing the same include a conductive film member.

Additional features of the inventive concepts will be set forth in the description which follows, and in part will be apparent from the description, or may be learned by practice of the inventive concepts.

A display device according to an exemplary embodiment includes a lower substrate having a display area and a pad area, a display structure disposed in the display area of the lower substrate, an upper substrate disposed on the display structure in the display area, and facing the lower substrate, pad electrodes disposed in the pad area of the lower substrate and spaced apart from each other in a first direction parallel to a top surface of the lower substrate, a conductive film member including conductive balls disposed on the pad electrodes, the conductive film member having a first area overlapping the pad electrodes and a second area not overlapping the pad electrodes, and a film package disposed on the conductive film member and including bump electrodes overlapping the first area of the conductive film member, in which the shape of the conductive balls disposed in the first area is different from those disposed in the second area.

The conductive balls may be arranged in the first direction and a second direction orthogonal to the first direction, and be spaced apart from each other at equidistant intervals.

The conductive balls may not overlap each other in a third direction perpendicular to the first and second directions.

The conductive balls may include first conductive balls disposed in the first area, and second conductive balls disposed in the second area, and a diameter of each of the first conductive balls in a third direction perpendicular to the first and second directions may be less than a diameter of each of the second conductive balls in the third direction.

A portion of each of the first conductive balls may directly contact at least one of the pad electrode and the bump electrode.

The conductive film member may further include a film layer partially covering the conductive balls.

A thickness of the film layer disposed in the first area may be different from a thickness of the film layer disposed in the second area.

The film layer disposed in the first area may have a first thickness and expose at least a portion of each of the conductive balls disposed in the first area, and the film layer disposed in the second area may have a second thickness greater than the first thickness and cover the conductive balls disposed in the second area.

The film package may further include a base substrate disposed on the bump electrodes.

The conductive film member may electrically connect the film package and the pad electrodes disposed in the first area, and a top surface of the conductive film member disposed in the second area may be spaced apart from a bottom surface of the base substrate.

The display device may further include an adhesive member disposed between the conductive film member and the film package disposed in the second area.

A method of manufacturing a display device according to another exemplary embodiment includes providing a lower substrate having a display area and a pad area, forming a display structure in the display area of the lower substrate, forming pad electrodes in the pad area of the lower substrate to be spaced apart from each other in a first direction parallel to a top surface of the lower substrate, forming an upper substrate on the display structure to face the lower substrate in the display area, forming a conductive film member including a non-cured resin layer and conductive balls arranged in a lattice shape on the pad electrodes, the non-cured resin layer overlapping the pad electrodes, and forming a film package on the non-cured resin layer, the film package including bump electrodes overlapping the pad electrodes.

The conductive balls may be arranged in the first direction and a second direction orthogonal to the first direction, and be spaced apart from each other at equidistant intervals.

The method may further include placing a heating member to contact a top surface of the film package, applying heat and a pressure to the top surface of the film package, and curing the non-cured resin layer to form a cured-resin layer.

The pressure applied to the top surface of the film package may reduce intervals between the pad electrodes and the bump electrodes, such that a shape of each of the conductive balls disposed between the pad electrodes and the bump electrodes is deformed.

The cured-resin layer may at least partially cover the conductive balls, the cured-resin layer may have a first area where the pad electrodes overlap the bump electrodes, and a second area where the pad electrodes do not overlap the bump electrodes, the cured-resin layer disposed in the first area may have a first thickness and exposes at least a portion of each of the conductive balls disposed in the first area, and the cured-resin layer disposed in the second area may have a second thickness greater than the first thickness and covers the conductive balls disposed in the second area.

The conductive balls may include first conductive balls disposed in the first area, and second conductive balls disposed in the second area, and a diameter of each of the first conductive balls in a first direction from the film package to the pad electrode may be less than a diameter of each of the second conductive balls in the first direction.

The conductive balls may not overlap each other in a first direction from the film package to the pad electrode in each of the first and second areas.

The method may further include placing a resin on one side of the pad electrodes, forming the resin in the second area, and curing the resin.

The resin disposed on the one side of the pad electrodes may penetrate into the second area through a capillary phenomenon, and the resin includes a photo-curable resin.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 9, 10, 11, 12, 13, 14, 15, 16, 17, 18, 19, 20, and 21 are views illustrating a method of manufacturing a display device according to an exemplary embodiment.

DETAILED DESCRIPTION

Figure 1:
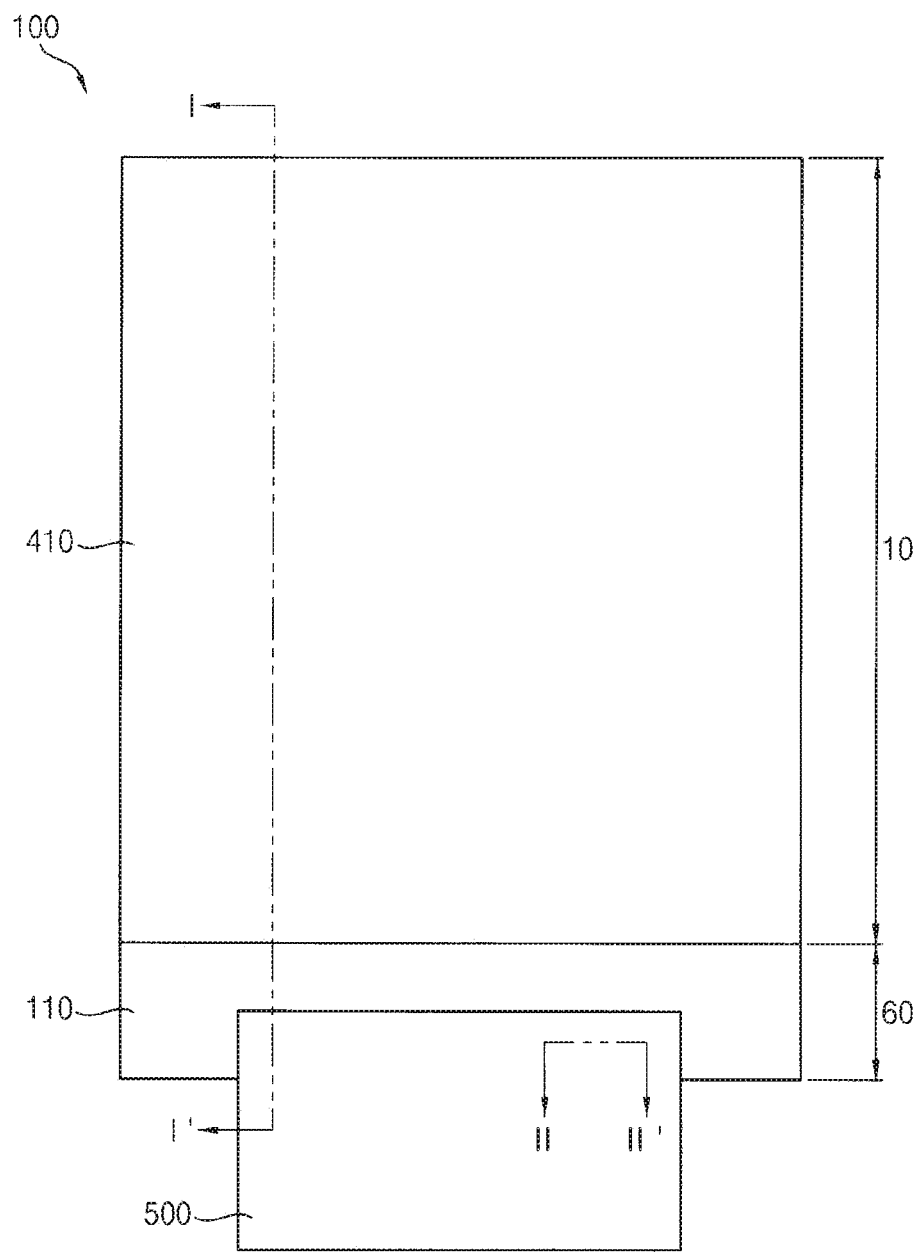
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
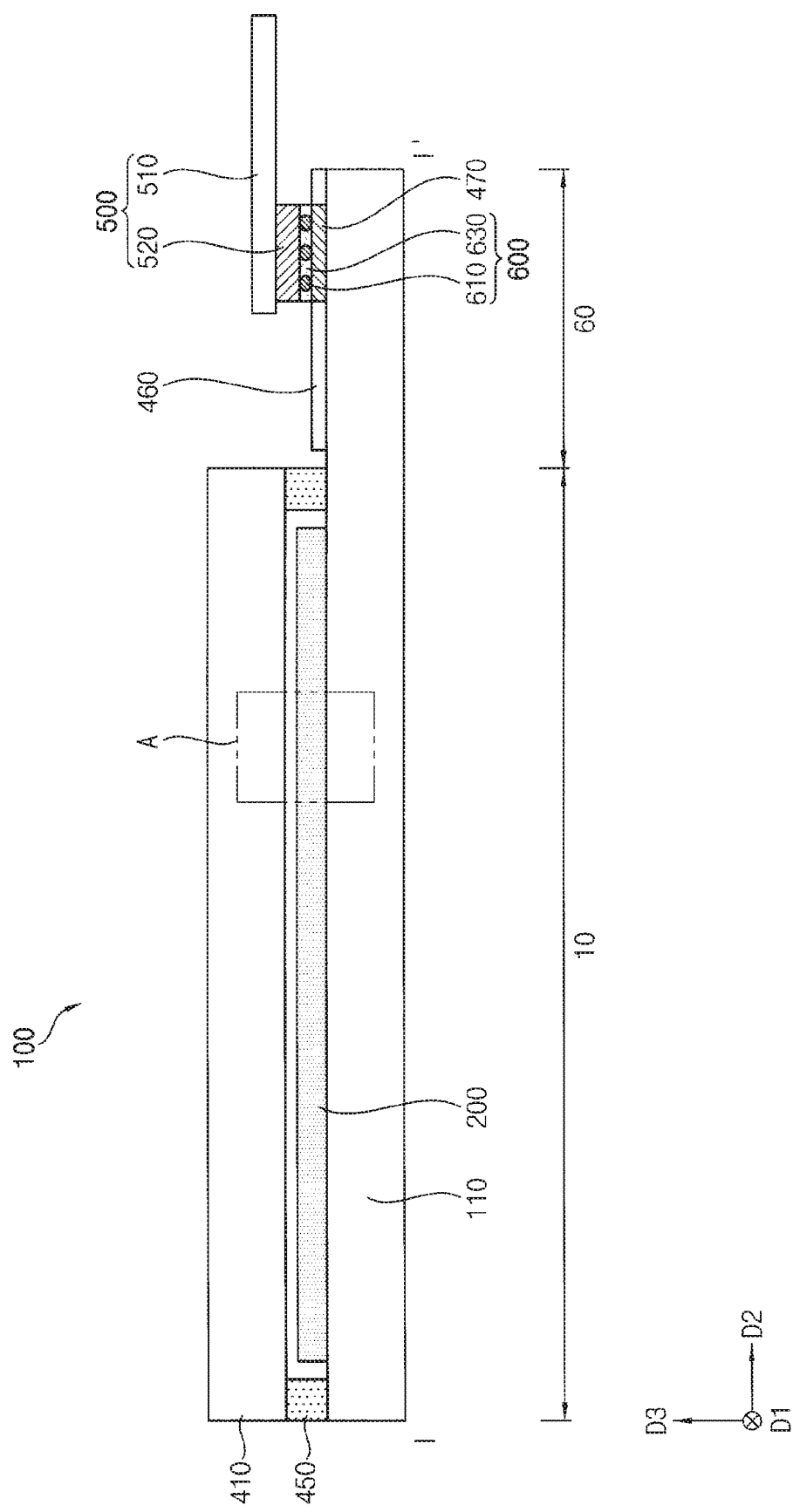
FIG. 2 is a cross-sectional view taken along line I-I' of FIG. 1.
Figure 3:
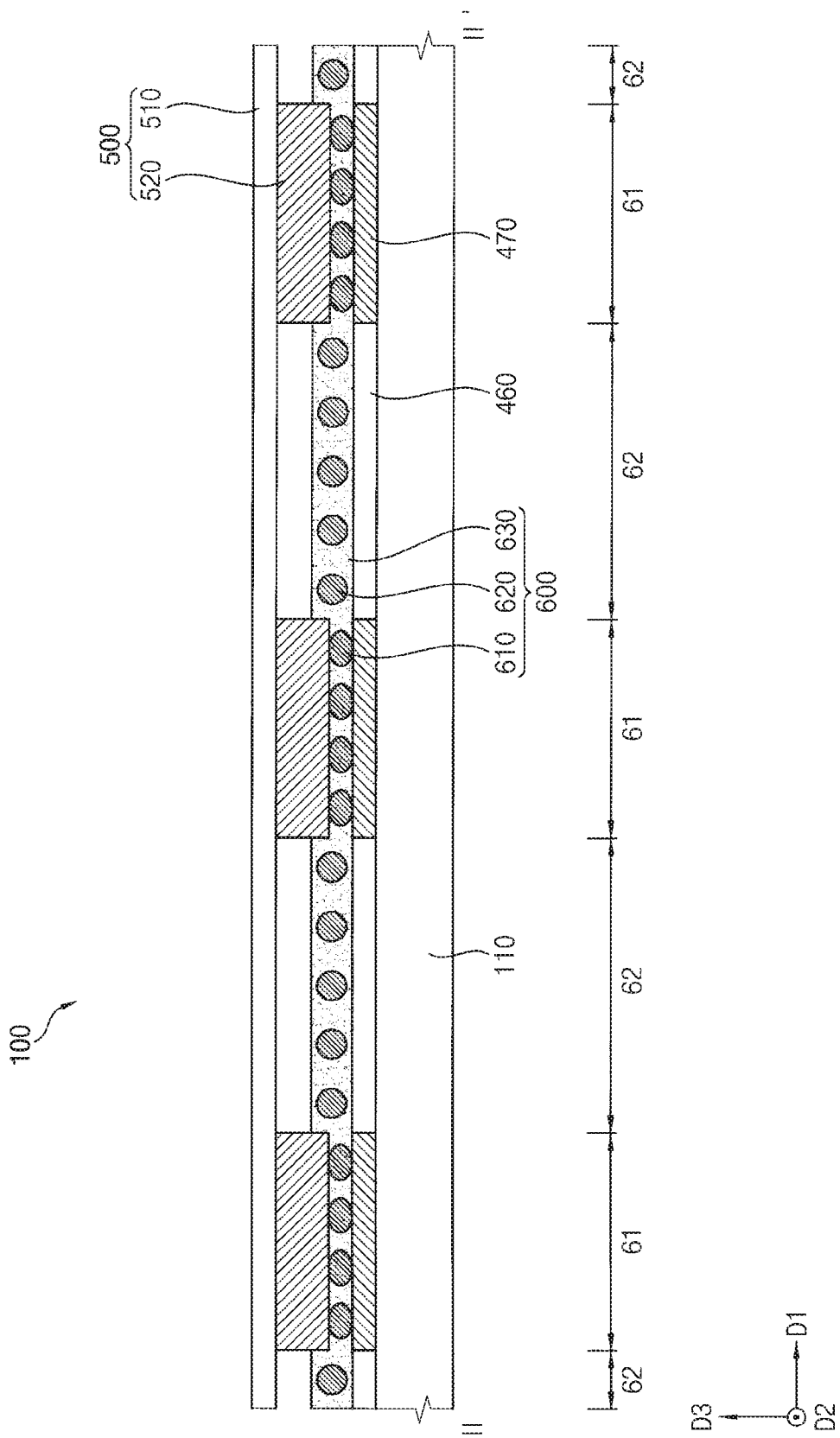
FIG. 3 is a cross-sectional view taken along line II-II' of FIG. 1.
Figure 4:
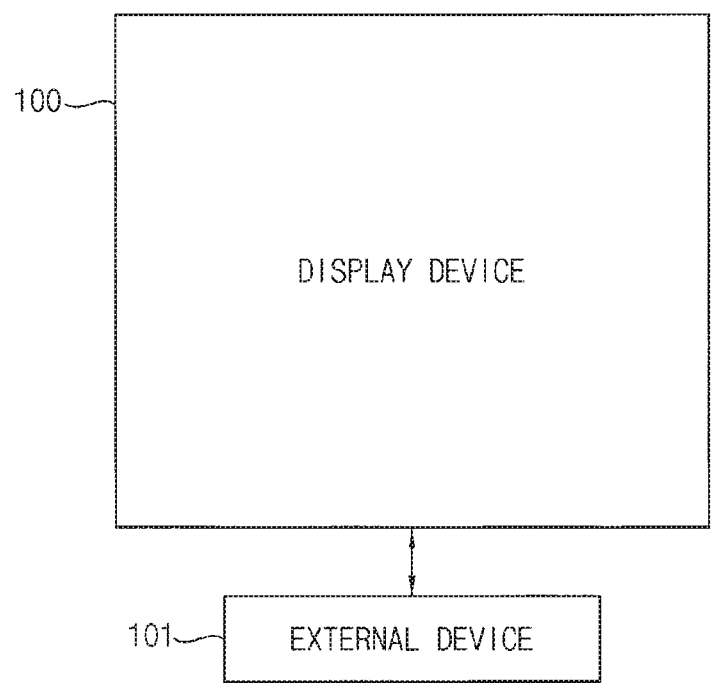
FIG. 4 is a block diagram of an external device electrically connected to the display device of FIG. 1.

FIG. 1 is a plan view of a display device according to an exemplary embodiment, FIG. 2 is a cross-sectional view taken along line I-I' of FIG. 1, FIG. 3 is a cross-sectional view taken along line II-II' of FIG. 1, and FIG. 4 is a block diagram of an external device electrically connected to the display device of FIG. 1.

Referring to FIGS. 1, 2, 3, and 4, a display device 100 may include a lower substrate 110, a display structure 200, an upper substrate 410, a sealing member 450, an insulating layer 460, pad electrodes 470, a conductive film member 600, a film package 500, and the like. The lower substrate 110 may include a display area 10 and a pad area 60 located at one side of the display area 10. The conductive film member 600 may include conductive balls and a film layer 630, and the conductive balls may include first conductive balls 610 and second conductive balls 620. In addition, the film package 500 may include a base substrate 510 and bump electrodes 520.

The lower substrate 110 may include a transparent or opaque material. For example, the lower substrate 110 may include a quartz substrate, a synthetic quartz substrate, a calcium fluoride substrate, a fluorine-doped quartz substrate (F-doped quartz substrate), a soda lime glass substrate, a non-alkali glass substrate, etc. In other exemplary embodiments, the lower substrate 110 may include a transparent resin substrate having flexibility, such as a polyimide substrate. In this case, the polyimide substrate may include a first polyimide layer, a barrier film layer, a second polyimide layer, and the like.

The display structure 200 (e.g., display structure 200 of FIG. 5) may be disposed in the display area 10 of the lower substrate 110. An image (e.g., video image) may be displayed in the display area 10 through the display structure 200.

The upper substrate 410 may be disposed in the display area 10 of the display structure 200. The upper substrate 410 may face the lower substrate 110, and may not be disposed in the pad area 60. The upper substrate 410 may include substantially the same material as the lower substrate 110. For example, the upper substrate 410 may include a quartz substrate, a synthetic quartz substrate, a calcium fluoride substrate, an F-doped quartz substrate, a soda lime glass substrate, a non-alkali glass substrate, etc. In other exemplary embodiments, the upper substrate 410 may include a transparent inorganic material or flexible plastic. For example, the upper substrate 410 may include a transparent resin substrate having flexibility. In this case, in order to improve flexibility of an organic light emitting diode display device 100, the upper substrate 410 may have a structure, in which at least one inorganic layer and at least one organic layer are alternately stacked. More particularly, the stacked structure may include a first inorganic layer, an organic layer, and a second inorganic layer.

An outermost portion of the display area 10 may be defined as a peripheral area. The sealing member 450 may be disposed in the peripheral area between the lower substrate 110 and the upper substrate 410. In particular, the sealing member 450 may be disposed along the peripheral area, and may surround the display structure 200. The sealing member 450 may include a frit and the like. In addition, the sealing member 450 may further include a photocurable material. For example, the sealing member 450 may include a mixture of an organic material and a photocurable material, and the sealing member 450 may be obtained by irradiating the mixture with ultraviolet (UV) light, laser light, visible light, or the like to cure the mixture. The photocurable material included in the sealing member 450 may include an acryl resin, an epoxy resin, an epoxy acrylate resin, a polyester acrylate resin, a polyester urethane acrylate oligomer resin, a urethane acrylate resin, a urethane acrylate oligomer resin, a polybutadiene acrylate resin, a silicon acrylate resin, an alkyl acrylate resin, a vinyl phenol resin, a bismaleimide resin, a diallyl phthalate resin, etc. For example, the laser light may be irradiated to the mixture, which may change the mixture from a solid state to a liquid state, and the mixture in the liquid state may be cured back to the solid state after a predetermined time. As the state of the mixture changes, the upper substrate 410 may be coupled to the lower substrate 110 while being sealed with respect to the lower substrate 110.

Wires (e.g., gate signal wires, data signal wires, gate initialization signal wires, initialization voltage wires, light emission control signal wires, power supply voltage wires, etc.) may be disposed in the peripheral area on the lower substrate 110. In this case, first portions of the wires may be electrically connected to the display structure 200, and second portions of the wires may be electrically connected to the pad electrodes 470. In some exemplary embodiments, a gate driver and a data driver may be disposed in the peripheral area.

The pad electrodes 470 may be disposed in the pad area 60 on the lower substrate 110. The pad electrodes 470 may be spaced apart from each other in a first direction D1 parallel to a top surface of the lower substrate 110 (see FIG. 21). As shown in FIG. 3, a portion where the pad electrodes 470 are disposed may be defined as a first area 61, and a portion where the pad electrodes 470 are not disposed (e.g., a space between two adjacent pad electrodes 470 among the pad electrodes 470) may be defined as a second area 62. A width of each of the pad electrodes 470 in the first direction D1 (e.g., a width of the first area 61 in the first direction D1) may be about 14 micrometers, and a width of a space between two adjacent pad electrodes 470 in the first direction D1 (e.g., a width of the second area 62 in the first direction D1) may be about 16 micrometers.

For example, the pad electrodes 470 may include first to $n^{th}$ pad electrodes (where n is an integer of 1 or more), and the first to $n^{th}$ pad electrodes may be arranged in the first direction D1 in the pad area 60 while being spaced apart from each other at a predetermined interval. A portion where the first to $n^{th}$ pad electrodes are disposed may correspond to the first area 61, and a space between $k^{th}$ and $(k+1)^{th}$ pad electrodes among the first to $n^{th}$ pad electrodes may correspond to the second area 62 (where k is an integer between 1 and n).

In addition, the pad electrodes 470 may be electrically connected to a gate signal wire, a data signal wire, a gate initialization signal wire, an initialization voltage wire, a light emission control signal wire, a power supply voltage wire, and the like, which are disposed in the peripheral area. As shown in FIG. 4, the pad electrodes 470 may be electrically connected to the display device 100 and an external device 101. For example, the external device 101 may generate a gate signal, a data signal, a gate initialization signal, an initialization voltage, a light emission control signal, a power supply voltage, and the like. The external device 101 may be electrically connected to the display device 100 through the film package 500, the conductive film member 600, and the pad electrodes 470, and may provide the gate signal, the data signal, the gate initialization signal, the initialization voltage, the light emission control signal, the power supply voltage, and the like to the display structure 200.

Furthermore, the pad electrodes 470 may include metal, an alloy, metal nitride, conductive metal oxide, a transparent conductive material, etc. For example, pad electrodes 470 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other. In other exemplary embodiments, each of the pad electrodes 470 may have a multilayer structure including a plurality of metal layers.

Referring again to FIGS. 1, 2, and 3, the insulating layer 460 may be disposed in a portion of the pad area 60 on the lower substrate 110. In particular, the insulating layer 460 may surround each of the pad electrodes 470 in the pad area 60. For example, the insulating layer 460 may be disposed in the second area 62 on the lower substrate 110, and may not be disposed in the first area 61. In exemplary embodiments, a top surface of the insulating layer 460 and a top surface of each of the pad electrodes 470 may be located at the same level. In other exemplary embodiments, the insulating layer 460 may cover both sides of each of the pad electrodes 470, and the top surface of the insulating layer 460 may be located lower or higher than the top surface of each of the pad electrodes 470. The insulating layer 460 may include an organic material or an inorganic material. In exemplary embodiments, the insulating layer 460 may include an organic material, such as a photoresist, a polyacryl-based resin, a polyimide-based resin, a polyamide-based resin, a siloxane-based resin, an acryl-based resin, and an epoxy-based resin.

The conductive film member 600 may overlap the pad electrodes 470 and the insulating layer 460. The conductive film member 600 may include an anisotropic conducting film (ACF). The conductive film member 600 may electrically connect the film package 500 to the pad electrodes 470 in the first area 61, and a top surface of the conductive film member 600 may be spaced apart from a bottom surface of the base substrate 510.

In the illustrated exemplary embodiment, the conductive film member 600 may include the conductive balls and the film layer 630. The shapes of the conductive balls in the first area 61 may be different from the shapes of the conductive balls in the second area 62. For example, each of the conductive balls located in the first area 61 may have substantially an elliptical shape when viewed in a plan view, and each of the conductive balls located in the second area 62 may have substantially a circular shape when viewed in a plan view. In addition, the conductive balls may be arranged in the first direction D1 and a second direction D2 on the pad electrodes 470 and the insulating layer 460, and may be spaced apart from each other at equidistant intervals (see FIG. 13). In particular, the conductive balls may be arranged in only one layer, and may not overlap each other in a third direction D3 perpendicular to the first direction D1 and the second direction D2.

As shown in FIG. 3, the first conductive balls 610 may be disposed in the first area 61 between the pad electrodes 470 and the bump electrodes 520, and the second conductive balls 620 may be disposed in the second area 62. A diameter of each of the first conductive balls 610 in the third direction D3 may be less than a diameter of each of the second conductive balls 620 in the third direction D3. For example, the diameter of each of the second conductive balls 620 may be about 3.2 micrometers, and the diameter of each of the first conductive balls 610 may be about 2.8 micrometers. In the illustrated exemplary embodiment, at least a portion of each of the first conductive balls 610 may directly contact the pad electrodes 470 and the bump electrodes 520. Each of the conductive balls may have a structure, in which a spherical polymer is coated with a metal layer, such as nickel, cobalt, gold, silver, and copper.

The film layer 630 may partially cover the conductive balls. In the illustrated exemplary embodiment, a thickness of the film layer 630 in the first area 61 may be different from a thickness of the film layer 630 in the second area 62. For example, the film layer 630 may have a first thickness in the first area 61, and may expose at least a portion of each of the first conductive balls 610. In addition, the film layer 630 may have a second thickness greater than the first thickness in the second area 62, and may cover the second conductive balls 620 in the second area 62. Furthermore, in the second area 62, a top surface of the film layer 630 may be spaced apart from the bottom surface of the base substrate 510. In particular, an empty space defined by the top surface of the film layer 630, both side surfaces of each of the bump electrodes 520, and the bottom surface of the base substrate 510 may be formed in the second area 62. The film layer 630 may include a thermosetting resin or a photocurable resin. In the illustrated exemplary embodiment, the film layer 630 may include a thermosetting resin. For example, the film layer 630 may include an epoxy resin, an amino resin, a phenol resin, a urea resin, a melamine resin, an unsaturated polyester resin, a polyurethane resin, a polyimide resin, etc.

In the illustrated exemplary embodiment, although a length of the conductive film member 600 in the second direction D2 orthogonal to the first direction D1 has been described as being equal to a length of each of the pad electrodes 470 in the second direction D2, the inventive concepts are not limited thereto. For example, in other exemplary embodiments, the conductive film member 600 may extend in the second direction D2 and a direction opposite to the second direction D2, and the length of the conductive film member 600 in the second direction D2 may be greater than the length of each of the pad electrodes 470 in the second direction D2. In particular, the conductive film member 600 shown in FIG. 2 may extend so as to be disposed on the insulating layer 460.

In addition, in the illustrated exemplary embodiment, although the conductive balls have been described as being arranged in substantially a lattice shape, the inventive concepts are not limited thereto. For example, in other exemplary embodiments, the conductive balls may be arranged in substantially a rectangular or rhombus shape when viewed in a plan view.

Furthermore, in the illustrated exemplary embodiment, although the conductive balls have been described as having a circular shape or an elliptical shape when viewed in a plan view, the inventive concepts are not limited thereto. For example, in other exemplary embodiments, the conductive balls may have substantially a triangular shape, a rectangular shape, a rhombic shape, a polygonal shape, or a track shape, when viewed from a plan view.

For example, as the size of a conventional display device increases, and a resolution of the conventional display device increases, the number of signals input to the display device may be increased. As such, the display device may include a relatively large number of pad electrodes to receive the signals from the external device 101. In order to arrange the relatively large number of pad electrodes in a limited space, an interval between the pad electrodes may become relatively narrow. An anisotropic conductive film having a relatively thick thickness is generally included in the conventional display device. However, the conventional anisotropic conductive film may have a configuration, in which the conductive balls are irregularly arranged in one layer, or the conductive balls overlap each other in a plurality of layers in the third direction (e.g., a depth direction). In addition, in a process of curing the anisotropic film, when the film package 500 applies a pressure to the anisotropic conductive film in a direction opposite to the third direction D3, a relatively large amount of reflow may occur from the first area 61 to the second area 62, due to the thickness of film layer that is relatively thick. In this case, a density of the conductive balls may be relatively low in the first area 61, and the density of the conductive balls may be relatively high in the second area 62. Accordingly, adjacent pad electrodes 470 or adjacent bump electrodes 520 may be short-circuited by the conductive balls, and the pad electrode 470 and the bump electrode 520, which overlap each other, may not be electrically connected to each other.

The conductive film member 600 according to an exemplary embodiment may have a relatively thin thickness. For example, the conductive balls included in the conductive film member 600 may be regularly arranged while being spaced apart from each other at equidistant intervals. In addition, the conductive balls may be arranged in only one layer, and may not overlap each other in the third direction D3. In addition, in the process of curing the conductive film member 600, since the film layer 630 covering the conductive balls is formed of a non-cured resin layer, when the film package 500 applies the pressure to the conductive film member 600 in the direction opposite to the third direction D3, the non-cured resin layer located in the first area 61 may be reflowed into the second area 62, such that the non-cured resin layer may expose at least a portion of each of the first conductive balls 610 located in the first area 61, and the bump electrodes 520 and the pad electrodes 470 may easily make direct contact with the first conductive balls 610. In this case, since a relatively small amount of the non-cured resin layer is reflowed in the first area 61, the first conductive balls 610 may not be moved. In this manner, a density of the first conductive balls 610 may be relatively uniform in the first area 61. In addition, since a relatively small amount of the non-cured resin layer is reflowed from the first area 61 to the second area 62, the second conductive balls 620 may not be moved, such that a density of the second conductive balls 620 may also be uniform in the second area 62. Accordingly, the adjacent pad electrodes 470 or the adjacent bump electrodes 520 may not be short-circuited by the conductive balls, and the pad electrode 470 and the bump electrode 520, which overlap each other, may be easily and electrically connected to each other.

The film package 500 may be disposed on the conductive film member 600. The film package 500 may include a printed circuit board (PCB), a flexible printed circuit board (FPCB), or a flexible flat cable (FFC). As described above, the conductive film member 600 may electrically connect the external device 101 to the display device 100. For example, a first portion of the film package 500 may make direct contact with the conductive film member 600, and a second portion opposing the first portion of the film package 500 may make direct contact with the external device 101. In some exemplary embodiments, a driver integrated circuit may be mounted on the film package 500.

In the illustrated exemplary embodiment, the film package 500 may include the base substrate 510 and the bump electrodes 520. The bump electrodes 520 may be disposed on the bottom surface of the base substrate 510 while being spaced apart from each other. For example, the bump electrodes 520 may overlap the first area 61 on the conductive film member 600, and the base substrate 510 may be located in the first area 61 and the second area 62 on the bump electrodes 520. The base substrate 510 may include a flexible film including a material having flexibility. For example, the base substrate 510 may include a polyimide resin, a polyester resin, etc. The bump electrodes 520 may include metal, an alloy, metal nitride, conductive metal oxide, a transparent conductive material, etc. These may be used alone or in combination with each other. In other exemplary embodiments, the bump electrodes 520 may have a multilayer structure including a plurality of metal layers.

For example, the bump electrodes 520 may include first to $m^{th}$ bump electrodes (where m is an integer of 1 or more), and the first to $m^{th}$ bump electrodes may be disposed on the first to $n^{th}$ pad electrodes to overlap the first to $n^{th}$ pad electrodes, respectively.

The display device 100 according to the exemplary embodiments includes the film package 500 having a relatively thin thickness to prevent the adjacent pad electrodes 470 or the adjacent bump electrodes 520 from being short-circuited by the conductive balls, such that the pad electrode 470 and the bump electrode 520, which overlap each other, may be easily and electrically connected to each other.

Figure 5:
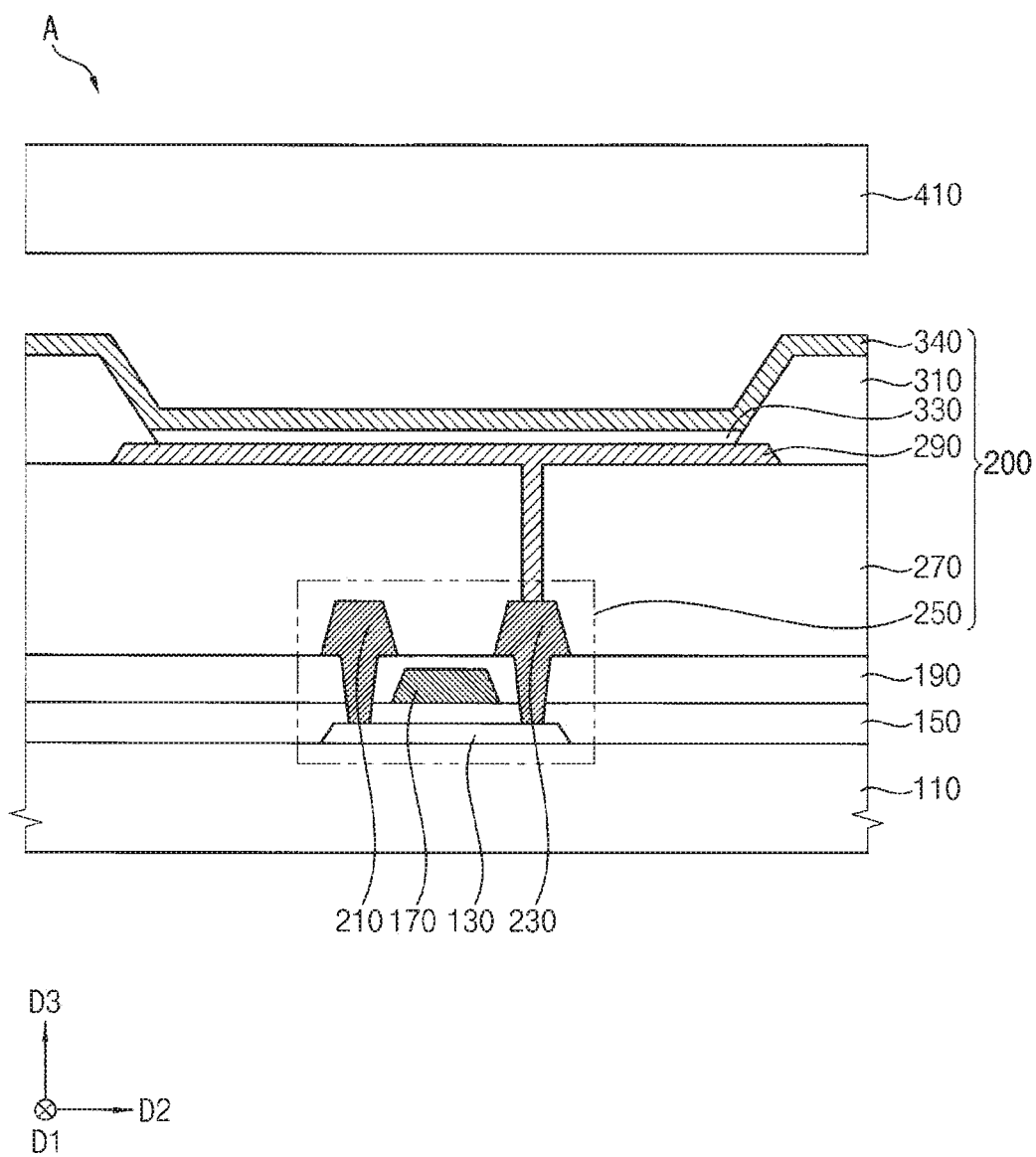
FIG. 5 is a partially enlarged view of area 'A' of FIG. 2.

FIG. 5 is a partially enlarged view of area 'A' of FIG. 2.

Referring to FIG. 5, the display structure 200 may include a semiconductor element 250, a planarization layer 270, a pixel defining layer 310, a lower electrode 290, a light emitting layer 330, and an upper electrode 340. The semiconductor element 250 may include an active layer 130, a gate insulating layer 150, a gate electrode 170, an interlayer insulating layer 190, a source electrode 210, and a drain electrode 230.

In some exemplary embodiments, a buffer layer may be disposed on the lower substrate 110. The buffer layer may prevent metal atoms or impurities from diffusing from the lower substrate 110, and may control a heat transfer rate during a crystallization process for forming the active layer 130 to obtain a substantially uniform active layer 130. In addition, when a surface of the lower substrate 110 is not uniform, the buffer layer may improve the flatness of the surface of the lower substrate 110. Depending on a type of the lower substrate 110, in some exemplary embodiments, at least two buffer layers may be provided on the lower substrate 110, or the buffer layer may be omitted. The buffer layer may include a silicon compound, metal oxide, etc.

The active layer 130 may be disposed on the lower substrate 110. The active layer 130 may include a metal oxide semiconductor, an inorganic semiconductor (e.g., amorphous silicon or poly silicon semiconductor), an organic semiconductor, etc. The active layer 130 may have a source region and a drain region.

The gate insulating layer 150 may be disposed on the active layer 130. The gate insulating layer 150 may be disposed on the lower substrate 110 to cover the active layer 130. For example, the gate insulating layer 150 may sufficiently cover the active layer 130, and may have a substantially flat top surface without creating a step around the active layer 130. In some exemplary embodiments, the gate insulating layer 150 may be disposed along a profile of the active layer 130 with a uniform thickness to cover the active layer 130 on the lower substrate 110. The gate insulating layer 150 may include a silicon compound, metal oxide, etc. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In other exemplary embodiments, the gate insulating layer 150 may have a multilayer structure including a plurality of insulating layers. For example, the insulating layers may have different thicknesses and/or include different materials.

The gate electrode 170 may be disposed on a portion of the gate insulating layer 150 under which the active layer 130 is located. The gate electrode 170 may include metal, an alloy, metal nitride, conductive metal oxide, a transparent conductive material, etc. These may be used alone or in combination with each other. In other exemplary embodiments, the gate electrode 170 may have a multilayer structure including a plurality of metal layers. For example, the metal layers may have different thicknesses and/or include different materials.

The interlayer insulating layer 190 may be disposed on the gate electrode 170. The interlayer insulating layer 190 may be disposed on the gate insulating layer 150 to cover the gate electrode 170. For example, the interlayer insulating layer 190 may sufficiently cover the gate electrode 170 on the gate insulating layer 150, and may have a substantially flat top surface without creating a step around the gate electrode 170. In some exemplary embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, etc. In other exemplary embodiments, the interlayer insulating layer 190 may have a multilayer structure including a plurality of insulating layers. For example, the insulating layers may have different thicknesses and/or include different materials.

The source electrode 210 and the drain electrode 230 may be disposed on the interlayer insulating layer 190. The source electrode 210 and the drain electrode 230 may be respectively connected to the source region and the drain region of the active layer 130 through contact holes formed by removing portions of the gate insulating layer 150 and the interlayer insulating layer 190. Each of the source electrode 210 and the drain electrode 230 may include metal, an alloy, metal nitride, conductive metal oxide, a transparent conductive material, etc. These may be used alone or in combination with each other. In other exemplary embodiments, the source electrode 210 and the drain electrode 230 may have a multilayer structure including a plurality of metal layers.

Accordingly, the semiconductor element 250 including the active layer 130, the gate insulating layer 150, the gate electrode 170, the interlayer insulating layer 190, the source electrode 210, and the drain electrode 230 may be provided.

Although the semiconductor element 250 has been described as having a top gate structure, the inventive concepts are not limited thereto. For example, in some exemplary embodiments, the semiconductor element 250 may have a bottom gate structure or a double gate structure.

The planarization layer 270 may be disposed on the source electrode 210 and the drain electrode 230. The planarization layer 270 may cover the source electrode 210 and the drain electrode 230. In particular, the planarization layer 270 may be disposed over the interlayer insulating layer 190. In the exemplary embodiments, the planarization layer 270 may have a relatively thick thickness to sufficiently cover the source electrode 210 and the drain electrode 230. In this case, the planarization layer 270 may have a substantially flat top surface. In order to form the planarization layer 270 having a substantially flat top surface, a planarization process may be additionally performed on the planarization layer 270. In some exemplary embodiments, the planarization layer 270 may be disposed along a profile of the source electrode 210 and the drain electrode 230 with a uniform thickness to cover the source electrode 210 and the drain electrode 230. The planarization layer 270 may be formed of an organic material or an inorganic material. In the illustrated exemplary embodiment, the planarization layer 270 may include an organic material.

The lower electrode 290 may be disposed on the planarization layer 270. The lower electrode 290 may be connected to the drain electrode 230 through a contact hole formed by removing a portion of the planarization layer 270. In addition, the lower electrode 290 may be electrically connected to the semiconductor element 250. The lower electrode 290 may include metal, an alloy, metal nitride, conductive metal oxide, a transparent conductive material, etc. These may be used alone or in combination with each other. In other exemplary embodiments, the lower electrode 290 may have a multilayer structure including a plurality of metal layers.

The pixel defining layer 310 may be disposed on the planarization layer 270 and may expose a portion of a top surface of the lower electrode 290. The pixel defining layer 310 may be formed of an organic material or an inorganic material. In the illustrated exemplary embodiment, the pixel defining layer 310 may include an organic material.

The light emitting layer 330 may be disposed on the lower electrode 290, which is at least partially exposed. The light emitting layer 330 may be formed by using at least one of light emitting materials for emitting different color lights (e.g., red light, green light, blue light, etc.) according to sub-pixels. Alternatively, the light emitting layer 330 may be formed by laminating a plurality of light emitting materials for emitting different color lights, such as red light, green light, and blue light, to emit white light as a whole. In this case, a color filter may be disposed on the light emitting layer 330. The color filter may include at least one of a red color filter, a green color filter, and a blue color filter. In some exemplary embodiments, the color filter may include a yellow color filter, a cyan color filter, and a magenta color filter, for example. The color filter may include a photosensitive resin or a color photoresist.

The upper electrode 340 may be disposed on the pixel defining layer 310 and the light emitting layer 330. The upper electrode 340 may include metal, an alloy, metal nitride, conductive metal oxide, a transparent conductive material, etc. In other exemplary embodiments, the upper electrode 340 may have a multilayer structure including a plurality of metal layers.

Although the display device 100 has been described as an organic light emitting diode display device, the inventive concepts are not limited thereto. In other exemplary embodiments, the display device 100 may include a liquid crystal display device (LCD), a field emission display device (FED), a plasma display device (PDP), or an electrophoretic image display device (EPD).

Figure 6:
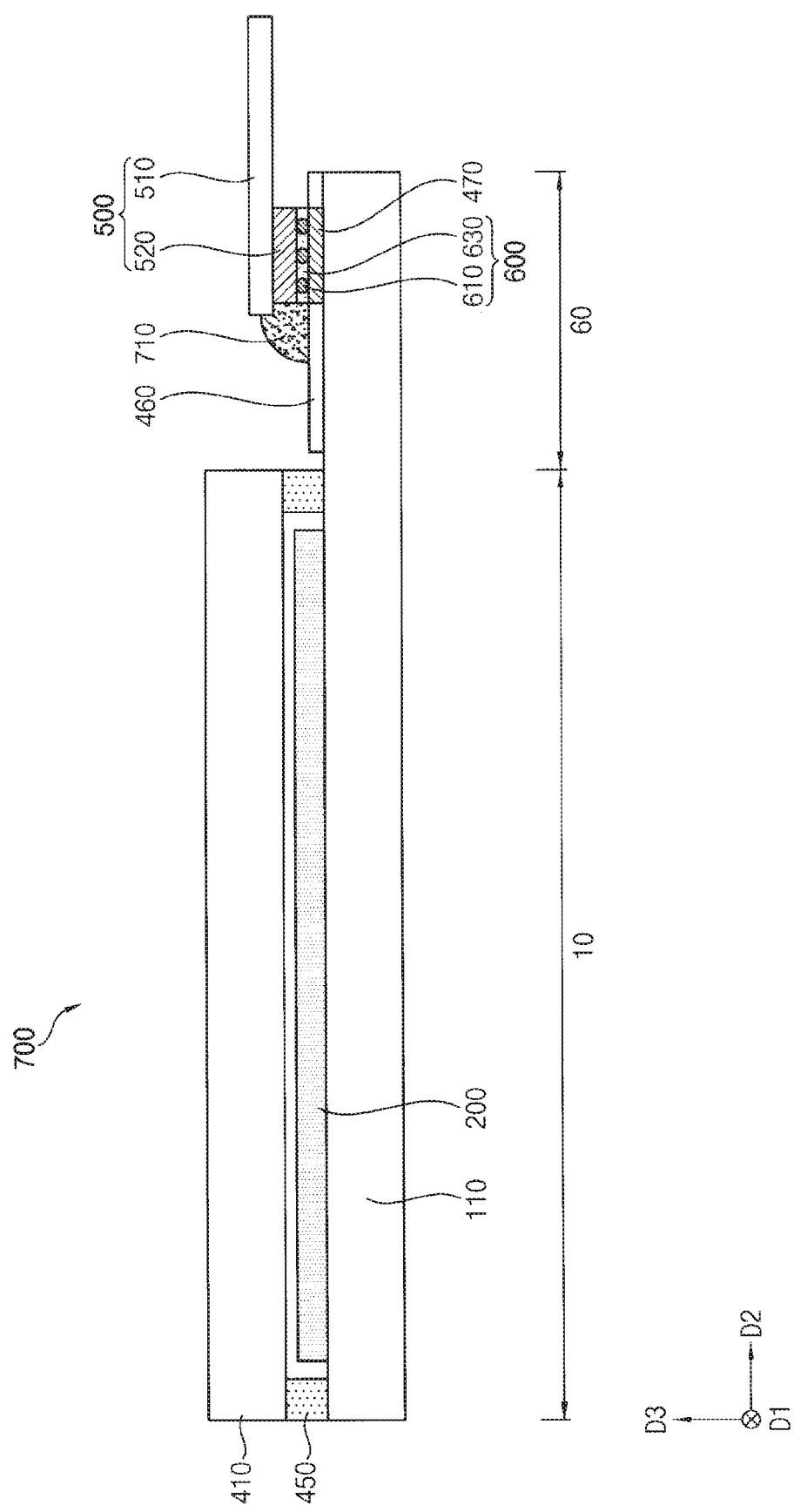
FIGS. 6 and 7 are cross-sectional views of the display device according to exemplary embodiments.
Figure 7:
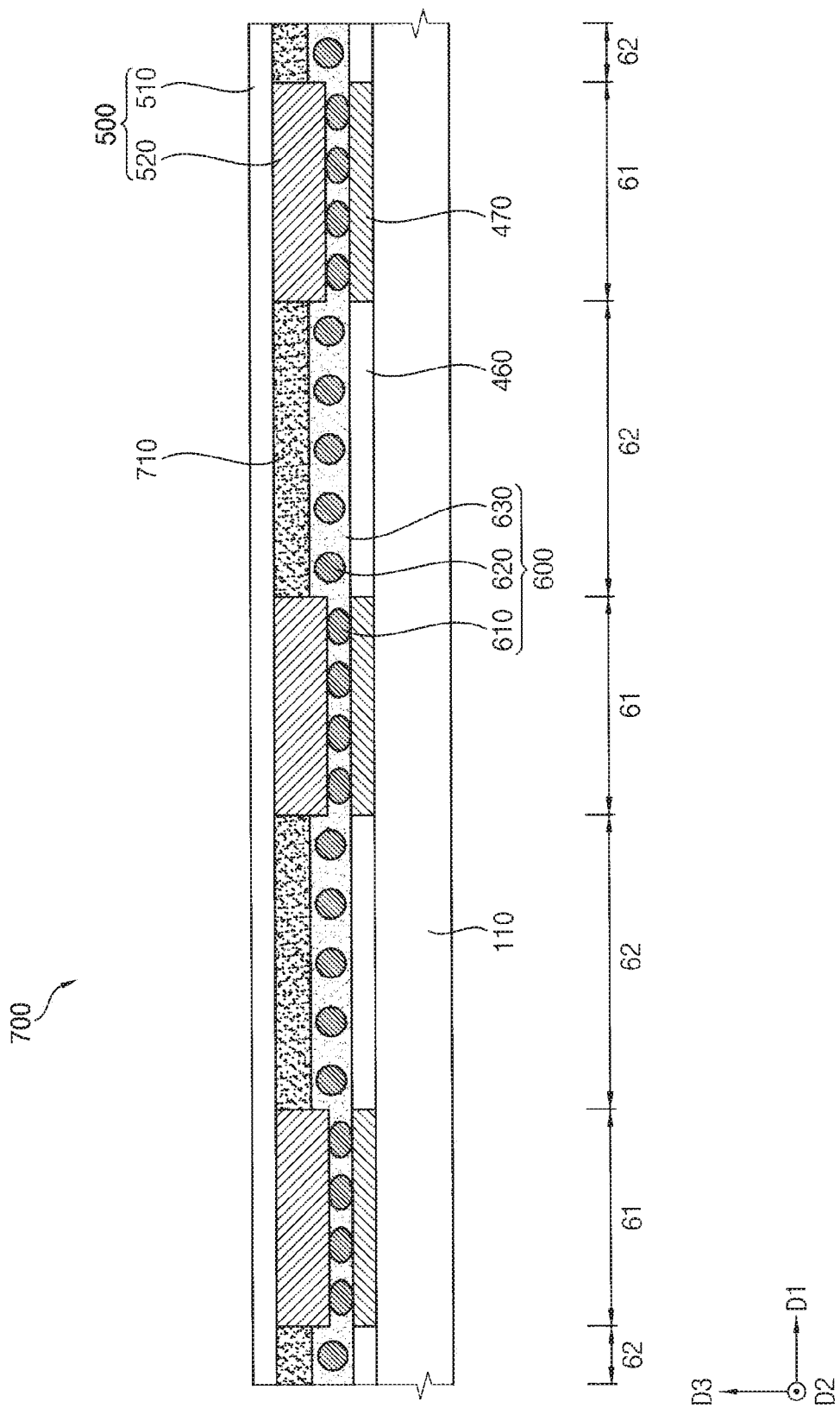
Figure 8:
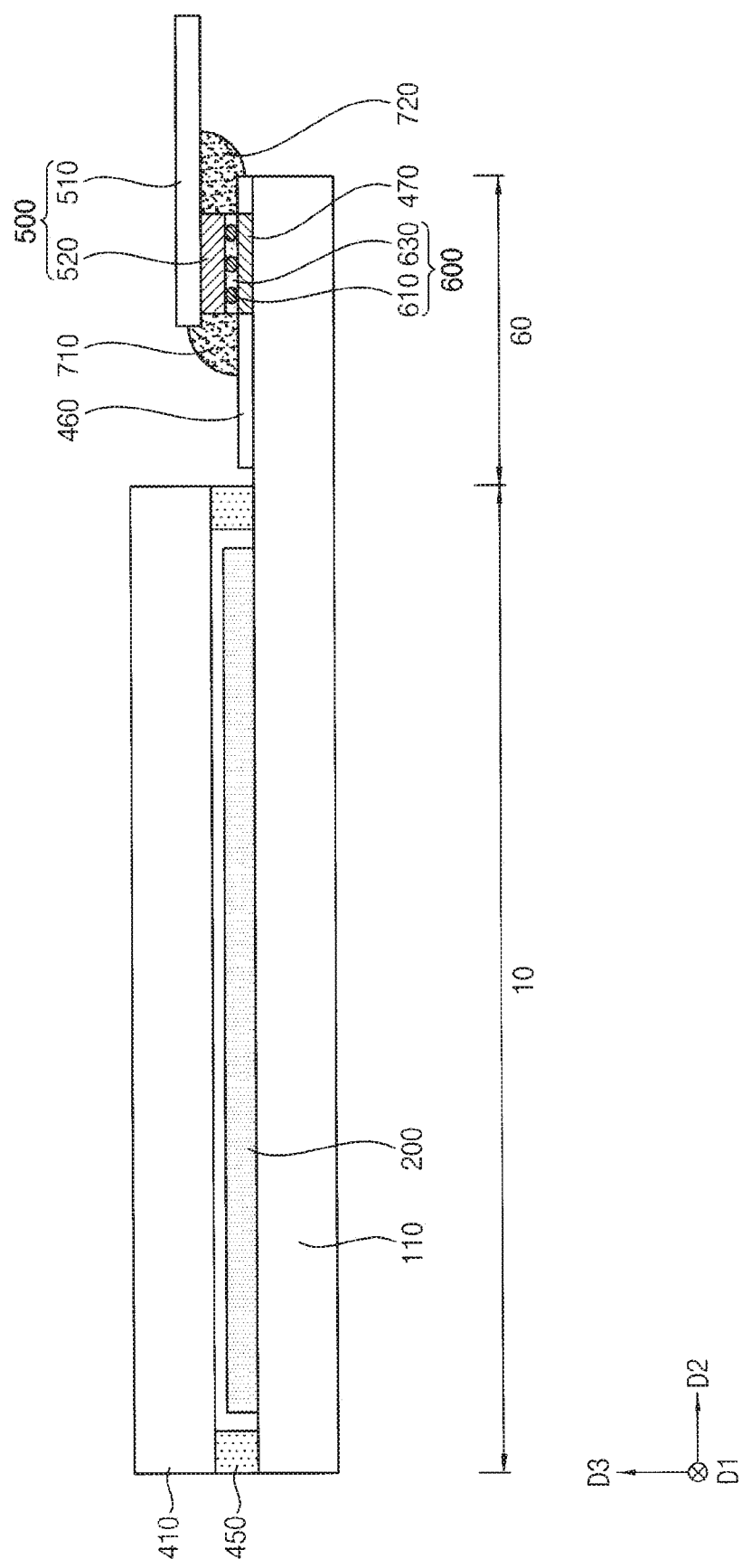
FIG. 8 is a cross-sectional view of an adhesive member shown in FIG. 6 according to an exemplary embodiment.

FIGS. 6 and 7 are cross-sectional views of a display device according to another exemplary embodiment, and FIG. 8 is a cross-sectional view of an adhesive member shown in FIG. 6 according to another exemplary embodiment. The display device 700 illustrated in FIGS. 6 and 7 may have a configuration substantially identical or similar to that of the display device 100 described with reference to FIGS. 1 to 5, except for an adhesive member 710. As such, repeated descriptions of the substantially the same components described above with reference to FIGS. 1 to 5 will be omitted to avoid redundancy.

Referring to FIGS. 1, 6, and 7, the display device 700 may include a lower substrate 110, a display structure 200, an upper substrate 410, a sealing member 450, an insulating layer 460, pad electrodes 470, a conductive film member 600, a film package 500, an adhesive member 710, and the like. The lower substrate 110 may include a display area 10 and a pad area 60 located at one side of the display area 10. The conductive film member 600 may include conductive balls and a film layer 630, and the conductive balls may include first conductive balls 610 and second conductive balls 620. In addition, the film package 500 may include a base substrate 510 and bump electrodes 520. Furthermore, a portion where the pad electrodes 470 are disposed may be defined as a first area 61, a portion where the pad electrodes 470 are not disposed may be defined as a second area 62, and an empty space defined by a top surface of the film layer 630, both side surfaces of each of the bump electrodes 520, and a bottom surface of the base substrate 510 may be formed in the second area 62.

The adhesive member 710 may be disposed in a portion of the pad area 60 and the second area 62 on the insulating layer 460. In particular, the adhesive member 710 may be disposed on a first side of the conductive film member 600 adjacent to the sealing member 450, a first side of the film package 500, a portion of a side surface of the base substrate 510, the empty space, and the like (see also FIGS. 20 and 21). For example, the adhesive member 710 may make direct contact with the top surface of the film layer 630, the both side surfaces of each of the bump electrodes 520, and the bottom surface of the base substrate 510. Since the adhesive member 710 is disposed in the empty space, the film package 500 and the conductive film member 600 may be firmly adhered to each other. The adhesive member 710 may include a thermosetting resin or a photocurable resin. In the illustrated exemplary embodiment, the adhesive member 710 may include a photocurable resin. For example, the adhesive member 710 may include an acryl resin, an epoxy resin, an epoxy acrylate resin, a polyester acrylate resin, a polyester urethane acrylate oligomer resin, a urethane acrylate resin, a urethane acrylate oligomer resin, a polybutadiene acrylate resin, a silicon acrylate resin, an alkyl acrylate resin, a vinyl phenol resin, a bismaleimide resin, a diallyl phthalate resin, etc.

Since the display device 700 according to the illustrated exemplary embodiment includes the adhesive member 710, an adhesive strength between the film package 500 and the conductive film member 600 may be increased.

Referring FIG. 8, the display device 700 according to another exemplary embodiment may further include a sub-adhesive member 720. The sub-adhesive member 720 may be disposed on a second side opposing the first side of the conductive film member 600, a second side opposing the first side of the film package 500, a portion of the bottom surface of the base substrate 510, and the like. The sub-adhesive member 720 may make contact with an end of the adhesive member 710 disposed in the second area 62. Since the display device 700 further includes the sub-adhesive member 720, the adhesive strength between the film package 500 and the conductive film member 600 may be further increased.

FIGS. 9 to 21 are views illustrating a method of manufacturing a display device according to an exemplary embodiment. For example, FIGS. 9, 10, 11, 12, 14, 15, 16, 17, 18, and 19 correspond to cross-sectional views of the display device, and FIGS. 13, 20, and 21 correspond to plan views of the display device. In FIG. 20, the film package 500 is not shown in FIG. 21 for convenience of explanation.

Figure 9:
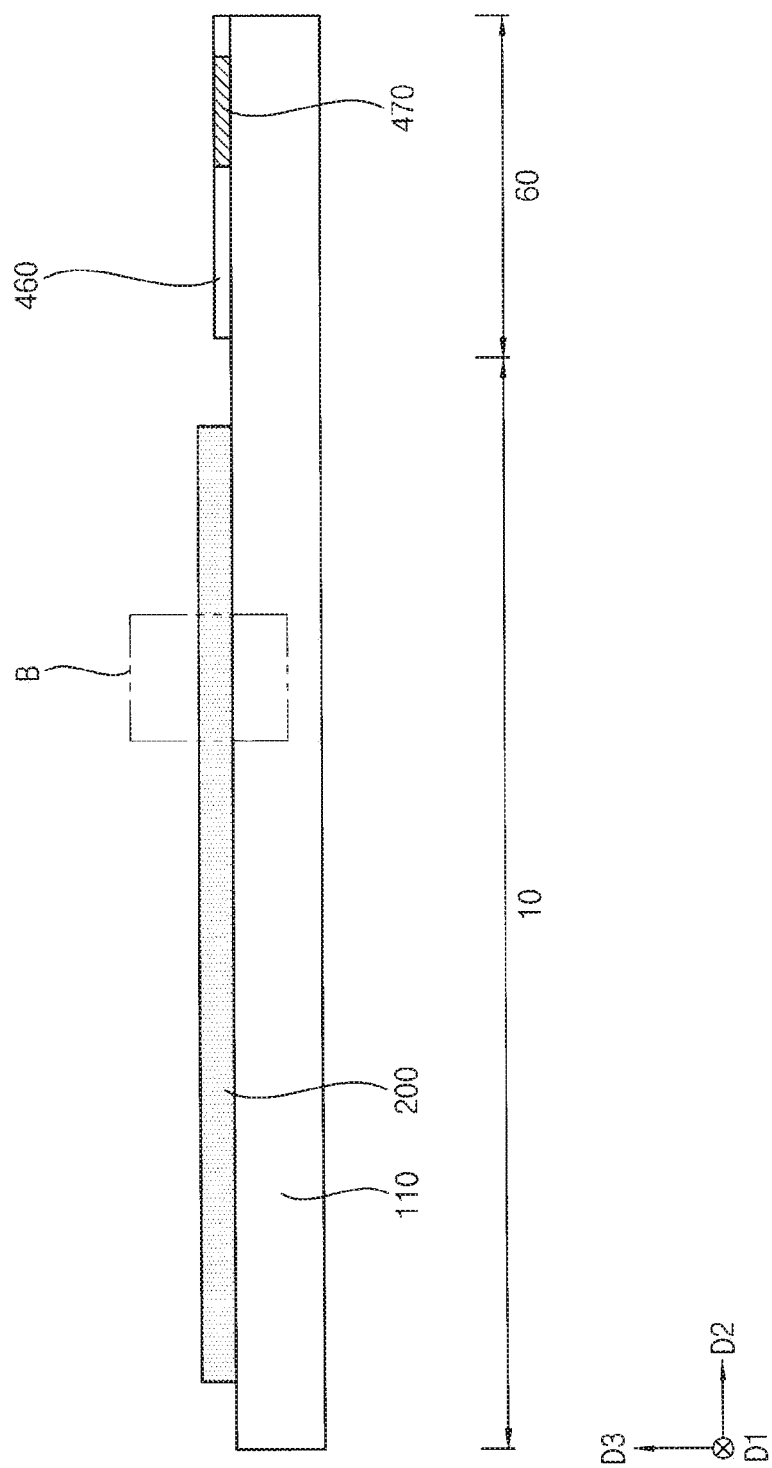
Figure 10:
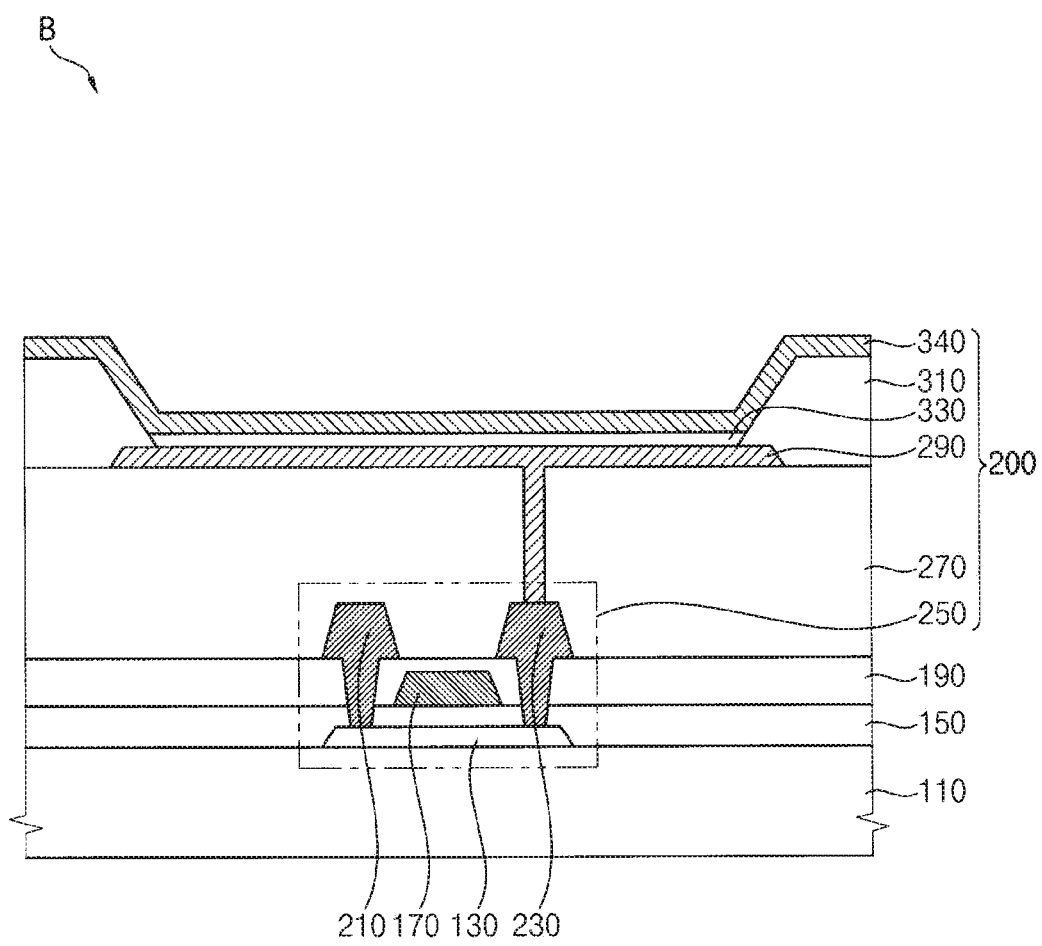
Figure 11:
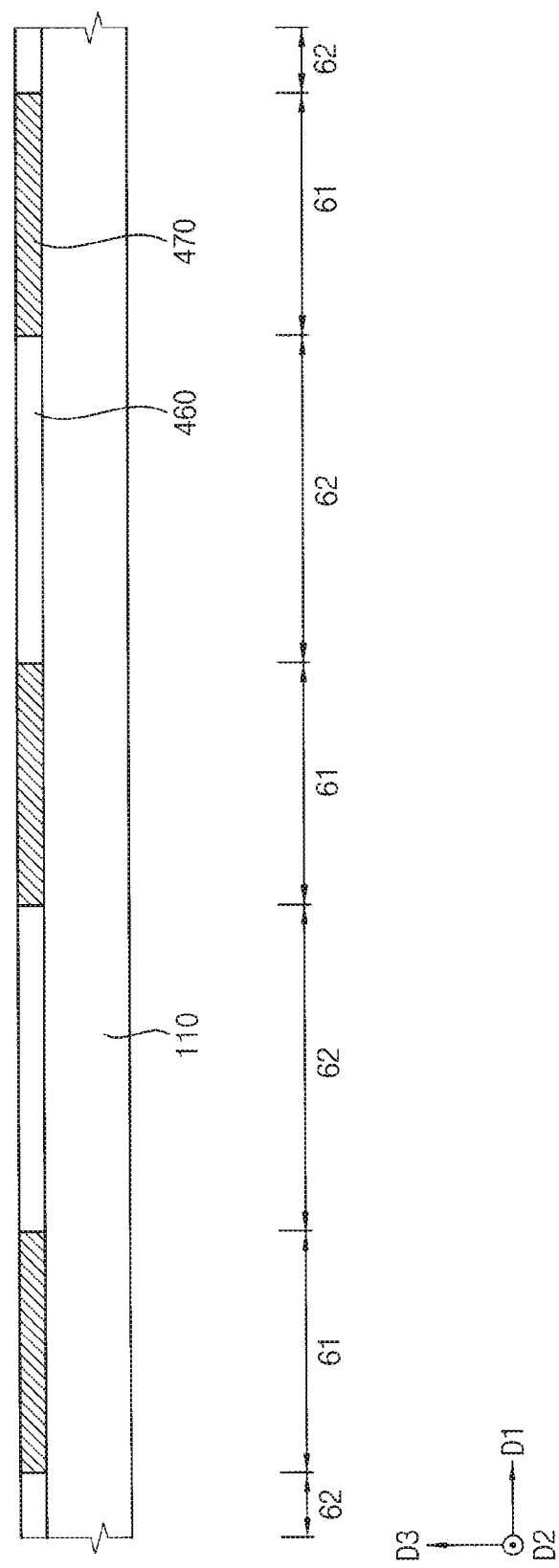

Referring to FIGS. 9, 10, and 11, the lower substrate 110 including a transparent or opaque material may be provided. The lower substrate 110 may be formed by using a quartz substrate, a synthetic quartz substrate, a calcium fluoride substrate, a fluorine-doped quartz substrate (F-doped quartz substrate), a soda lime glass substrate, a non-alkali glass substrate, etc.

The active layer 130 may be formed in the display area 10 on the lower substrate 110, and the active layer 130 may be formed by using a metal oxide semiconductor, an inorganic semiconductor, or an organic semiconductor. The active layer 130 may have a source region and a drain region.

The gate insulating layer 150 may be formed on the active layer 130. The gate insulating layer 150 may be formed on the lower substrate 110 to cover the active layer 130. For example, the gate insulating layer 150 may sufficiently cover the active layer 130, and may have a substantially flat top surface without creating a step around the active layer 130. In some exemplary embodiments, the gate insulating layer 150 may be formed along a profile of the active layer 130 with a uniform thickness to cover the active layer 130 on the lower substrate 110. The gate insulating layer 150 may include a silicon compound, metal oxide, etc. For example, the gate insulating layer 150 may be formed by using silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In other exemplary embodiments, the gate insulating layer 150 may have a multilayer structure including a plurality of insulating layers. For example, the insulating layers may have different thicknesses and/or include different materials.

The gate electrode 170 may be formed on a portion of the gate insulating layer 150 under which the active layer 130 is located. The gate electrode 170 may be formed by using metal, an alloy, metal nitride, conductive metal oxide, a transparent conductive material, etc. These may be used alone or in combination with each other. In other exemplary embodiments, the gate electrode 170 may have a multilayer structure including a plurality of metal layers. For example, the metal layers may have different thicknesses and/or mutually different materials.

The interlayer insulating layer 190 may be formed on the gate electrode 170. The interlayer insulating layer 190 may be formed on the gate insulating layer 150 to cover the gate electrode 170. For example, the interlayer insulating layer 190 may sufficiently cover the gate electrode 170 on the gate insulating layer 150, and may have a substantially flat top surface without creating a step around the gate electrode 170. In some exemplary embodiments, the interlayer insulating layer 190 may be formed along a profile of the gate electrode 170 with a uniform thickness to cover the gate electrode 170 on the gate insulating layer 150. The interlayer insulating layer 190 may include a silicon compound, metal oxide, etc. In other exemplary embodiments, the interlayer insulating layer 190 may have a multilayer structure including a plurality of insulating layers. For example, the insulating layers may have different thicknesses and/or include different materials.

The source electrode 210 and the drain electrode 230 may be formed on the interlayer insulating layer 190. The source electrode 210 and the drain electrode 230 may be respectively connected to the source region and the drain region of the active layer 130 through contact holes formed by removing portions of the gate insulating layer 150 and the interlayer insulating layer 190. Each of the source electrode 210 and the drain electrode 230 may be formed by using metal, an alloy, metal nitride, conductive metal oxide, a transparent conductive material, etc. These may be used alone or in combination with each other. In other exemplary embodiments, the source electrode 210 and the drain electrode 230 may have a multilayer structure including a plurality of metal layers. For example, the metal layers may have different thicknesses and/or include different materials.

Accordingly, the semiconductor element 250 including the active layer 130, the gate insulating layer 150, the gate electrode 170, the interlayer insulating layer 190, the source electrode 210, and the drain electrode 230 may be formed.

The planarization layer 270 may be formed on the source electrode 210 and the drain electrode 230. The planarization layer 270 may cover the source electrode 210 and the drain electrode 230. In particular, the planarization layer 270 may be formed over the interlayer insulating layer 190. In the illustrated exemplary embodiment, the planarization layer 270 may have a relatively thick thickness to sufficiently cover the source electrode 210 and the drain electrode 230. In this case, the planarization layer 270 may have a substantially flat top surface. In order to form the planarization layer 270 having a substantially flat top surface, a planarization process may be additionally performed on the planarization layer 270. In some exemplary embodiments, the planarization layer 270 may be formed along a profile of the source electrode 210 and the drain electrode 230 with a uniform thickness to cover the source electrode 210 and the drain electrode 230. The planarization layer 270 may be formed by using an organic material.

The lower electrode 290 may be formed on the planarization layer 270. The lower electrode 290 may be connected to the drain electrode 230 through a contact hole formed by removing a portion of the planarization layer 270. In addition, the lower electrode 290 may be electrically connected to the semiconductor element 250. The lower electrode 290 may by formed by using metal, an alloy, metal nitride, conductive metal oxide, a transparent conductive material, etc. These may be used alone or in combination with each other. In other exemplary embodiments, the lower electrode 290 may have a multilayer structure including a plurality of metal layers. For example, the metal layers may have different thicknesses and/or include different materials.

The pixel defining layer 310 may be formed on the planarization layer 270 and expose a portion of a top surface of the lower electrode 290. The pixel defining layer 310 may be formed by using an organic material.

The light emitting layer 330 may be formed on the lower electrode 290, which is at least partially exposed. The light emitting layer 330 may be formed by using at least one of light emitting materials for emitting different color lights (e.g., red light, green light, blue light, etc.) according to sub-pixels. Alternatively, the light emitting layer 330 may be formed by laminating a plurality of light emitting materials for emitting different color lights, such as red light, green light, and blue light, to emit white light as a whole. In this case, a color filter may be formed on the light emitting layer 330. The color filter may include at least one of a red color filter, a green color filter, and a blue color filter. In some exemplary embodiments, the color filter may by formed by using a yellow color filter, a cyan color filter, and a magenta color filter, for example. The color filter may include a photosensitive resin or a color photoresist.

The upper electrode 340 may be formed on the pixel defining layer 310 and the light emitting layer 330. The upper electrode 340 may be formed by using metal, an alloy, metal nitride, conductive metal oxide, a transparent conductive material, etc. In other exemplary embodiments, the upper electrode 340 may have a multilayer structure including a plurality of metal layers. For example, the metal layers may have different thicknesses and/or include different materials.

Accordingly, the display structure 200 including the semiconductor element 250, the planarization layer 270, the pixel defining layer 310, the lower electrode 290, the light emitting layer 330, and the upper electrode 340 may be formed.

The pad electrodes 470 may be formed in the pad area 60 on the lower substrate 110. The pad electrodes 470 may be spaced apart from each other in a first direction D1 parallel to a top surface of the lower substrate 110. As shown in FIG. 11, a portion where the pad electrodes 470 are disposed may be defined as a first area 61, and a portion where the pad electrodes 470 are not disposed may be defined as a second area 62.

The pad electrodes 470 may be formed by using metal, an alloy, metal nitride, conductive metal oxide, a transparent conductive material, etc. For example, pad electrodes 470 may include gold, silver, aluminum, platinum, nickel, titanium, palladium, magnesium, calcium, lithium, chromium, tantalum, tungsten, copper, molybdenum, scandium, neodymium, iridium, an aluminum-containing alloy, aluminum nitride, a silver-containing alloy, tungsten nitride, a copper-containing alloy, a molybdenum-containing alloy, titanium nitride, chromium nitride, tantalum nitride, strontium ruthenium oxide, zinc oxide, indium tin oxide, tin oxide, indium oxide, gallium oxide, indium zinc oxide, etc. These may be used alone or in combination with each other. In the illustrated exemplary embodiment, the pad electrodes 470 and the gate electrode 170 and/or the source and drain electrodes 210 and 230 may be simultaneously formed by using the same material. In other exemplary embodiments, each of the pad electrodes 470 may have a multilayer structure including a plurality of metal layers. For example, the metal layers may have different thicknesses and/or include different materials.

The insulating layer 460 may be formed in a portion of the pad area 60 on the lower substrate 110. In particular, the insulating layer 460 may be formed in the second area 62 on the lower substrate 110, and may not be formed in the first area 61. In the illustrated exemplary embodiment, a top surface of the insulating layer 460 and a top surface of each of the pad electrodes 470 may be located at the same level. However, the inventive concepts are not limited thereto. For example, in other exemplary embodiments, the insulating layer 460 may cover both sides of each of the pad electrodes 470, and the top surface of the insulating layer 460 may be located lower or higher than the top surface of each of the pad electrodes 470. The insulating layer 460 may be formed by using an organic material. For example, the insulating layer 460 may include a photoresist, a polyacryl-based resin, a polyimide-based resin, a polyamide-based resin, a siloxane-based resin, an acryl-based resin, an epoxy-based resin, etc. In the illustrated exemplary embodiment, the insulating layer 460 and the planarization layer 270 may be simultaneously formed by using the same material.

Figure 12:
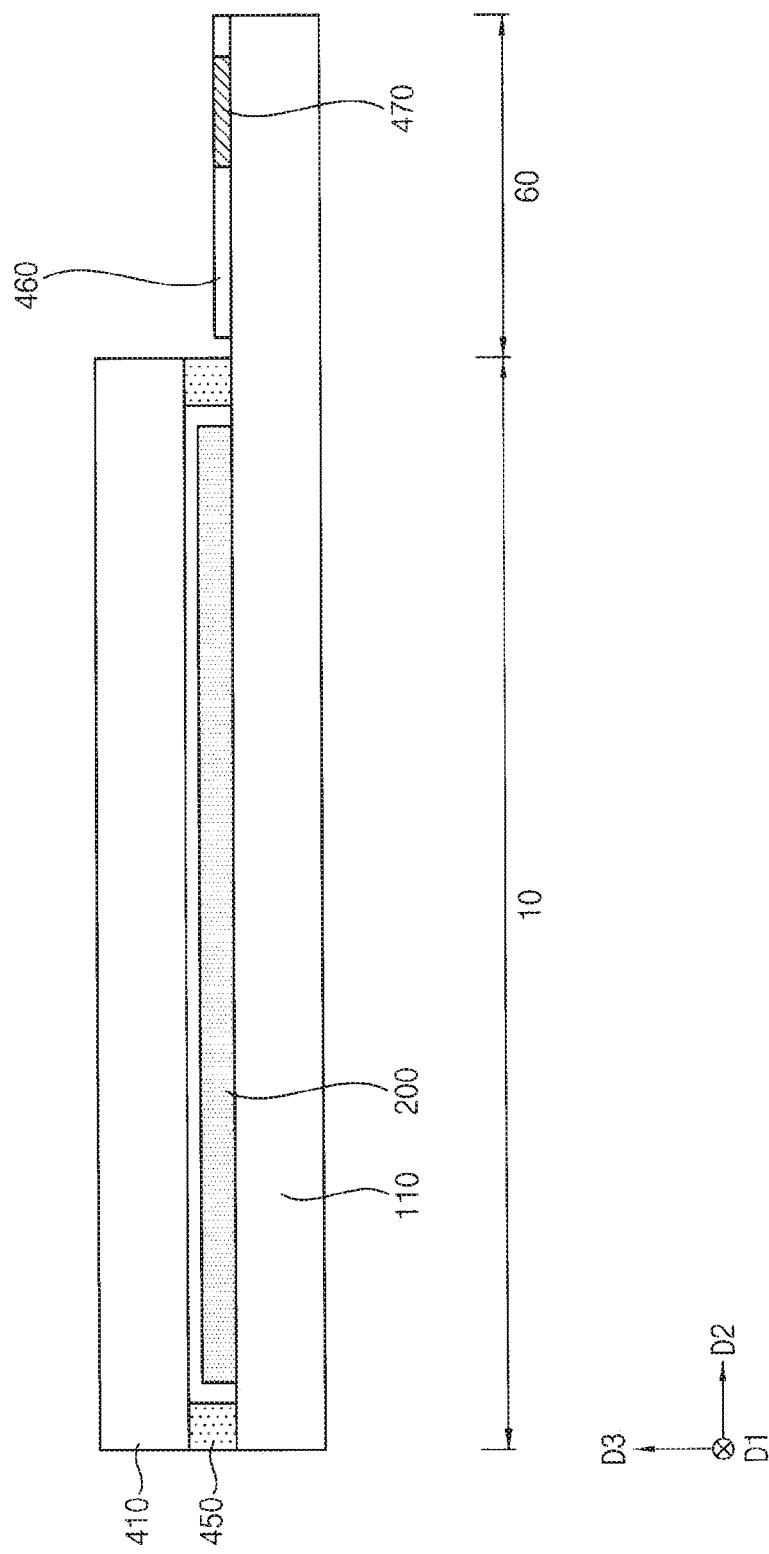

Referring to FIG. 12, the upper substrate 410 may be provided. The upper substrate 410 may include substantially the same material as the lower substrate 110. For example, the upper substrate 410 may be formed by using a quartz substrate, a synthetic quartz substrate, a calcium fluoride substrate, an F-doped quartz substrate, a soda lime glass substrate, a non-alkali glass substrate, etc.

The sealing member 450 may be formed on the bottom surface of the upper substrate 410. The sealing member 450 may be formed at an outermost portion of the upper substrate 410. The sealing member 450 may be formed by using a frit and the like. In addition, the sealing member 450 may further include a photocurable material. For example, the sealing member 450 may include a mixture of an organic material and a photocurable material.

After the sealing member 450 is formed on the bottom surface of the upper substrate 410, the upper substrate 410 may be placed on the lower substrate 110 and the display structure 200, such that the sealing member 450 surrounds the display structure 200.

After the upper substrate 410 is placed on the lower substrate 110, the sealing member 450 may be irradiated with ultraviolet light, laser light, visible light, or the like, so that the sealing member 450 may be cured. For example, the laser light may be irradiated to the mixture, such that the mixture may be changed from a solid state to a liquid state. Then, the mixture in the liquid state may be cured back to the solid state after a predetermined time. As the state of the mixture changes, the upper substrate 410 may be coupled to the lower substrate 110 and seal the display structure 200.

Figure 13:
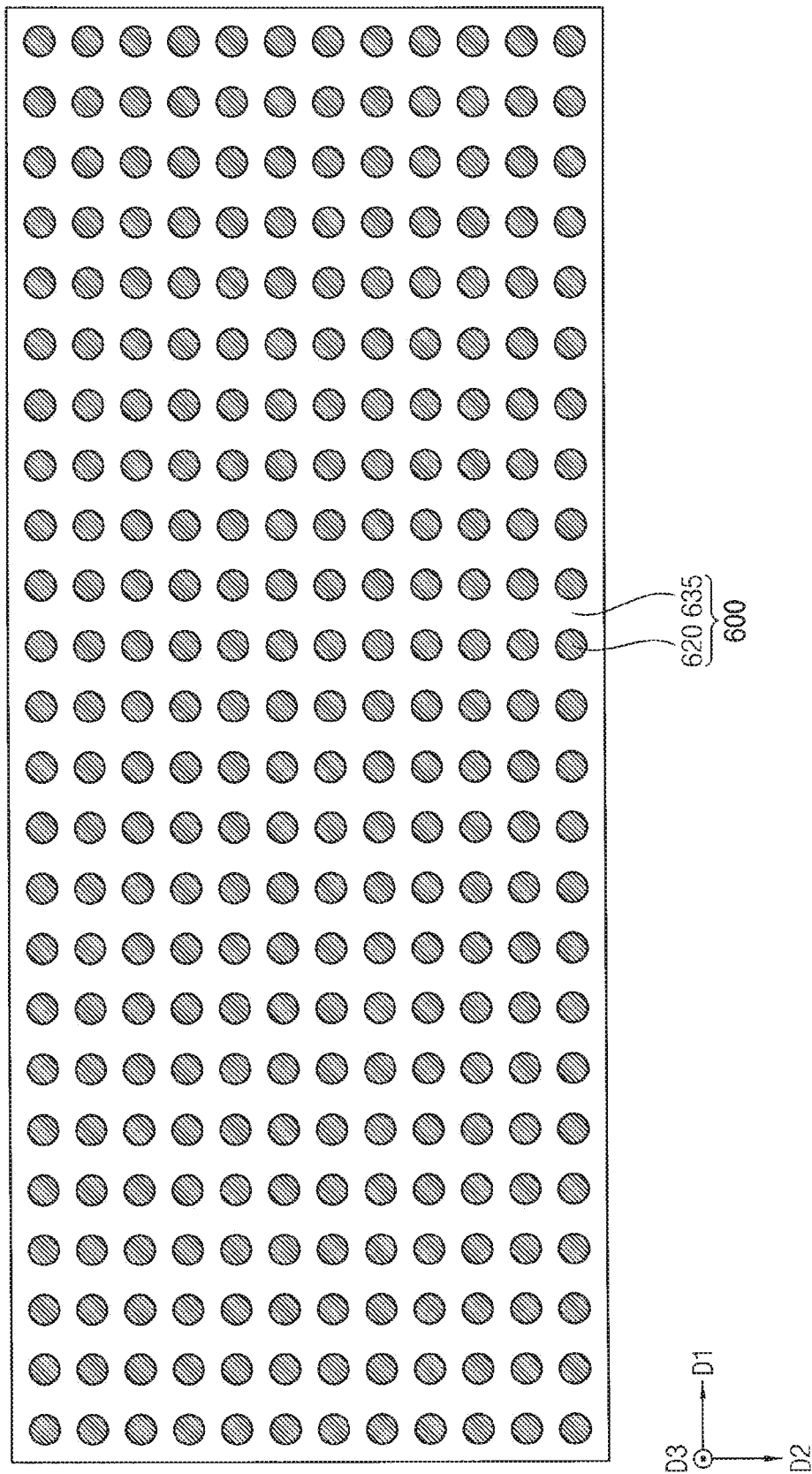

Referring to FIG. 13, the conductive film member 600 may be provided. The conductive film member 600 may include an anisotropic conducting film (ACF). The conductive film member 600 may include the second conductive balls 620 and a non-cured resin layer 635. The non-cured resin layer 635 may cover the second conductive balls 620. Each of the second conductive balls 620 may have substantially a circular shape when viewed in a plan view, and the non-cured resin layer 635 may have a first viscosity. In addition, the second conductive balls 620 may be arranged in the first direction D1 and the second direction D2 within the non-cured resin layer 635, and may be regularly spaced apart from each other at equidistant intervals. In particular, the second conductive balls 620 may be arranged in only one layer in a lattice shape, and may not overlap each other in the third direction D3 perpendicular to the first direction D1 and the second direction D2. In exemplary embodiments, a thickness of the non-cured resin layer 635 in the third direction D3 may be greater than the diameter of each of the second conductive balls 620, or may be less than twice the diameter of each of the second conductive balls 620.

For example, when the thickness of the non-cured resin layer 635 is relatively large, a relatively large amount of the non-cured resin layer 635 may be reflowed during a process of curing the non-cured resin layer 635, which will be described in more later. In this case, the arrangement of the second conductive balls 620 located within the non-cured resin layer 635 may be changed, and some of the second conductive balls 620 may overlap each other in the third direction D3. As such, adjacent pad electrodes 470 may be short-circuited by the second conductive balls 620.

Accordingly, the thickness of the non-cured resin layer 635 may be determined depending on the amount of reflow.

Each of the second conductive balls 620 may have a structure, in which a spherical polymer is coated with a metal layer, such as nickel, cobalt, gold, silver, and copper. The non-cured resin layer 635 may be formed by using a thermosetting resin. For example, the non-cured resin layer 635 may include a non-cured epoxy resin, a non-cured amino resin, a non-cured phenol resin, a non-cured urea resin, a non-cured melamine resin, a non-cured unsaturated polyester resin, a non-cured polyurethane resin, a non-cured polyimide resin, etc.

Figure 14:
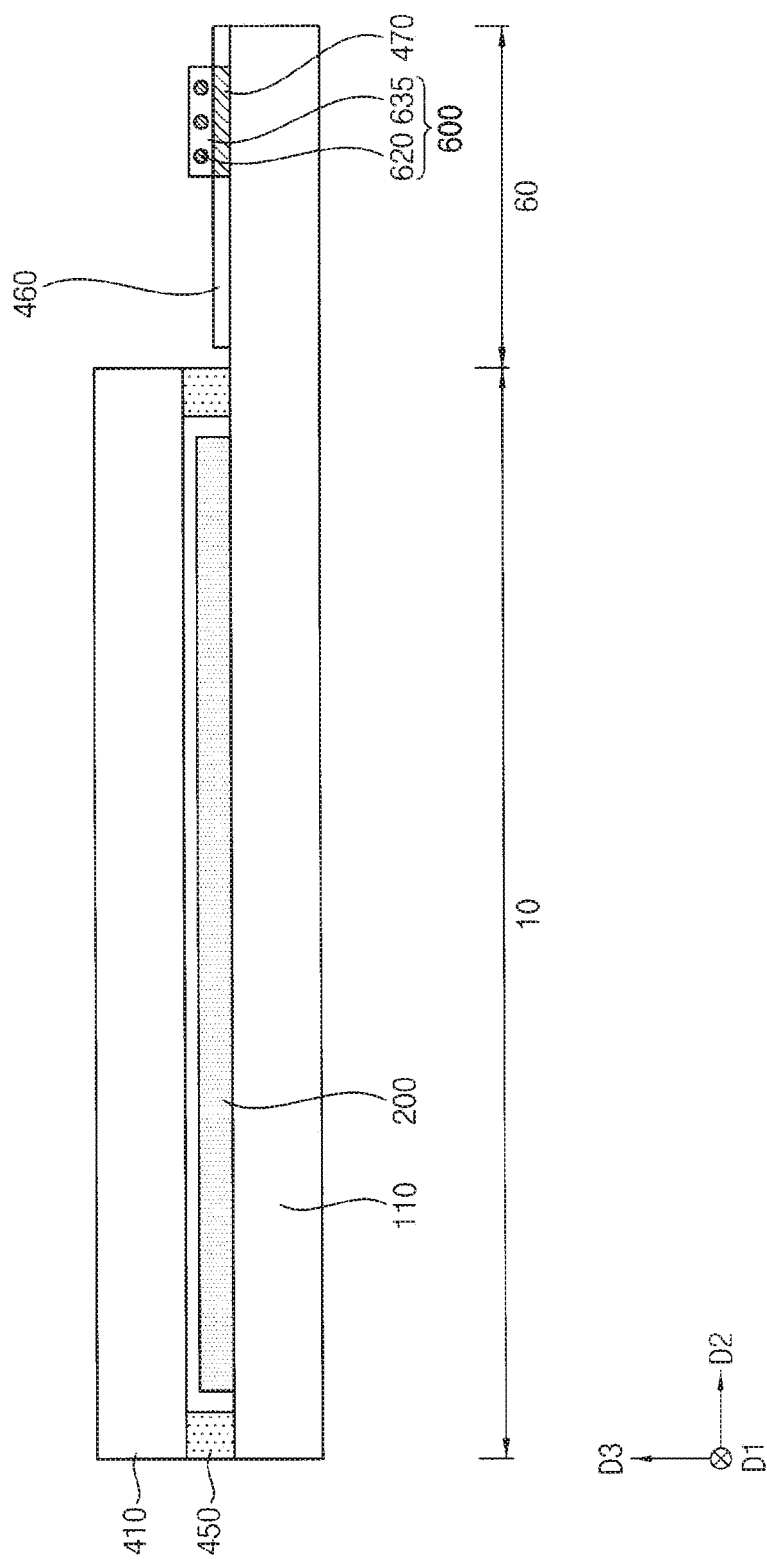
Figure 15:
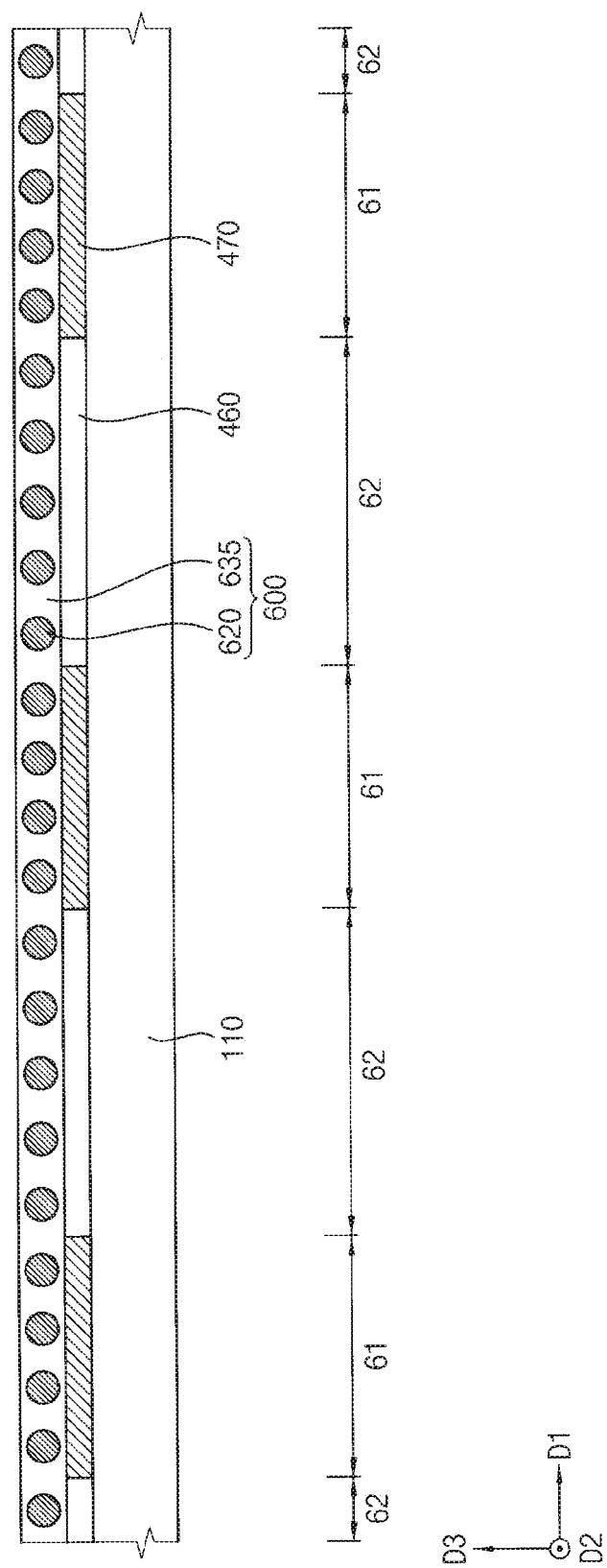

Referring to FIGS. 14 and 15, the conductive film member 600 including the second conductive balls 620 and the non-cured resin layer 635 may be located on the pad electrodes 470 to overlap the pad electrodes 470.

Figure 16:
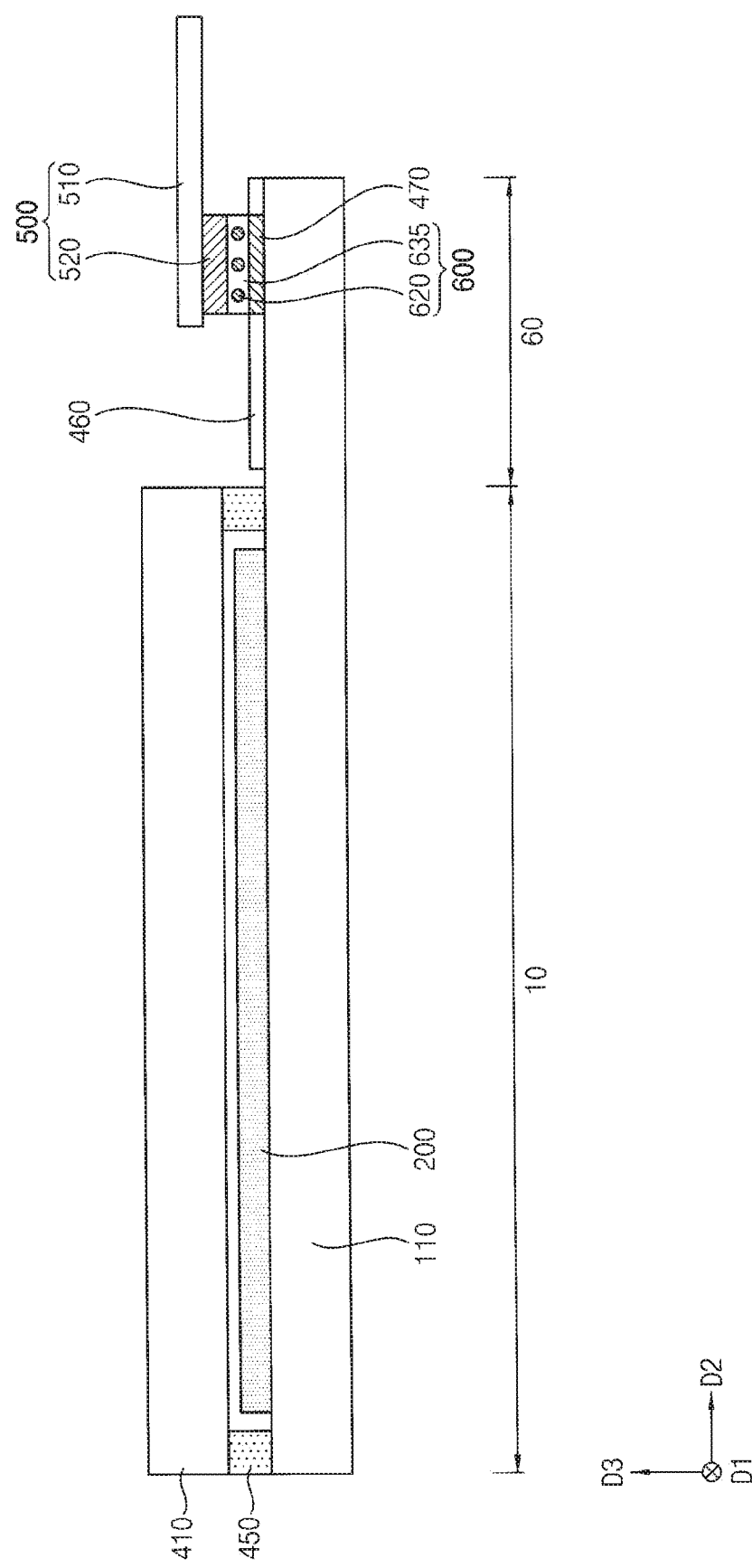
Figure 17:
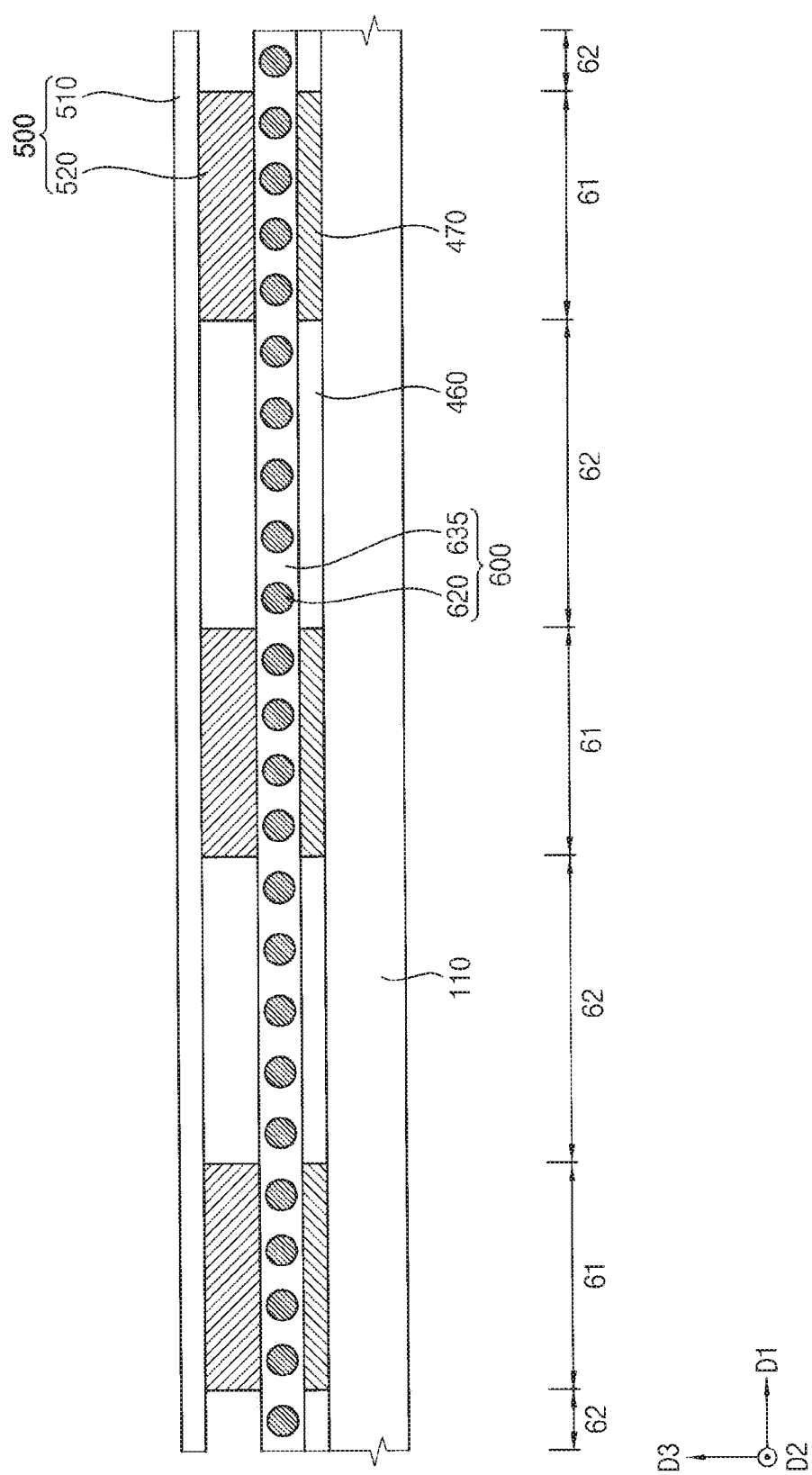

Referring to FIGS. 16 and 17, the film package 500 may be located on the conductive film member 600. The film package 500 may include a printed circuit board (PCB), a flexible printed circuit board (FPCB), or a flexible flat cable (FFC).

The film package 500 may include the base substrate 510 and the bump electrodes 520. The bump electrodes 520 may be formed on the bottom surface of the base substrate 510 while being spaced apart from each other. For example, the bump electrodes 520 may overlap the first area 61 on the conductive film member 600, and the base substrate 510 may be located in the first area 61 and the second area 62 on the bump electrodes 520. The base substrate 510 may be formed by using a flexible film including a material having flexibility. For example, the base substrate 510 may include a polyimide resin, a polyester resin, etc. The bump electrodes 520 may be formed by using metal, an alloy, metal nitride, conductive metal oxide, a transparent conductive material, etc. These may be used alone or in combination with each other. In other exemplary embodiments, the bump electrodes 520 may have a multilayer structure including a plurality of metal layers. For example, the metal layers may have different thicknesses and/or include different materials.

Figure 18:
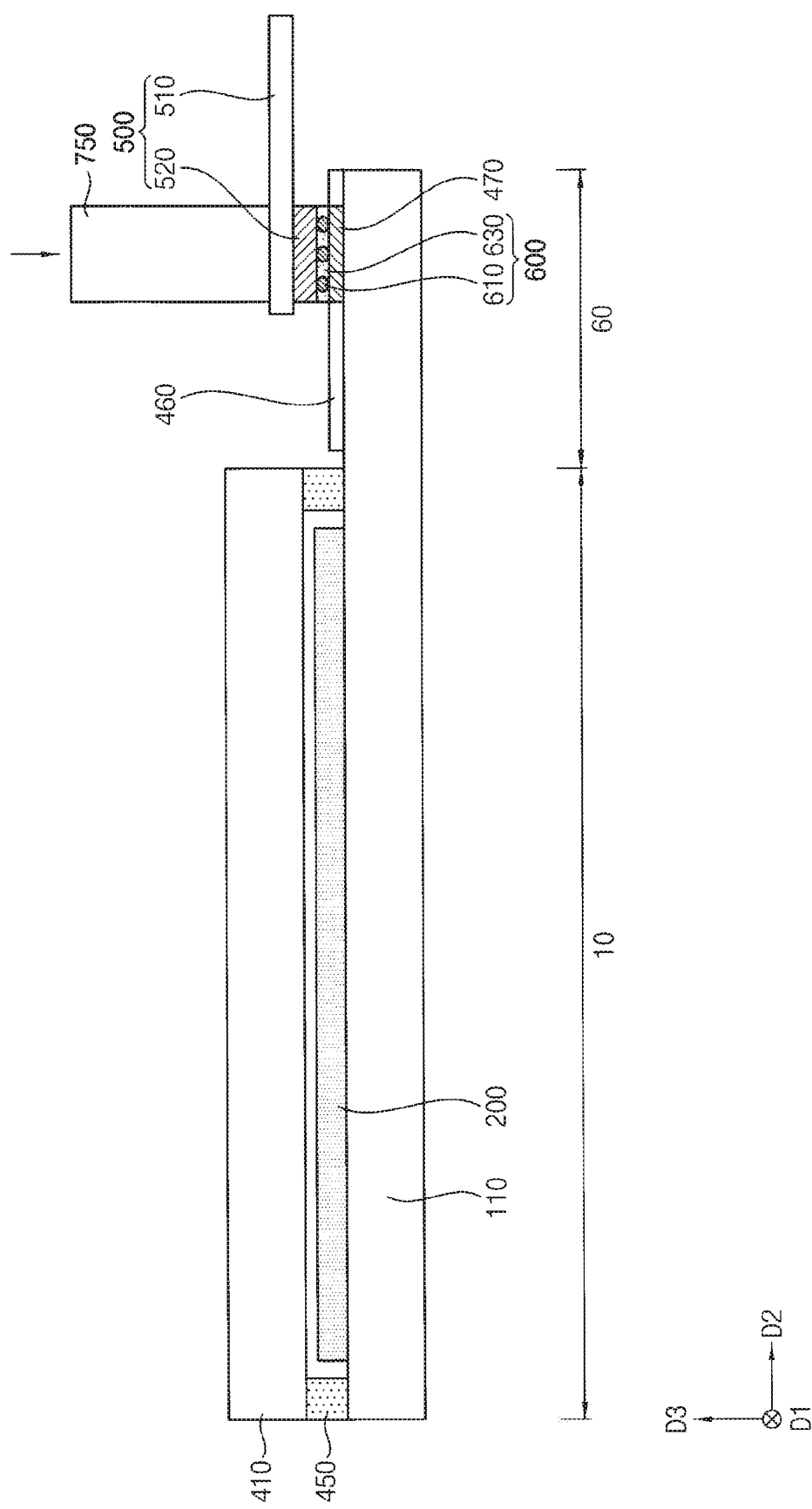
Figure 19:
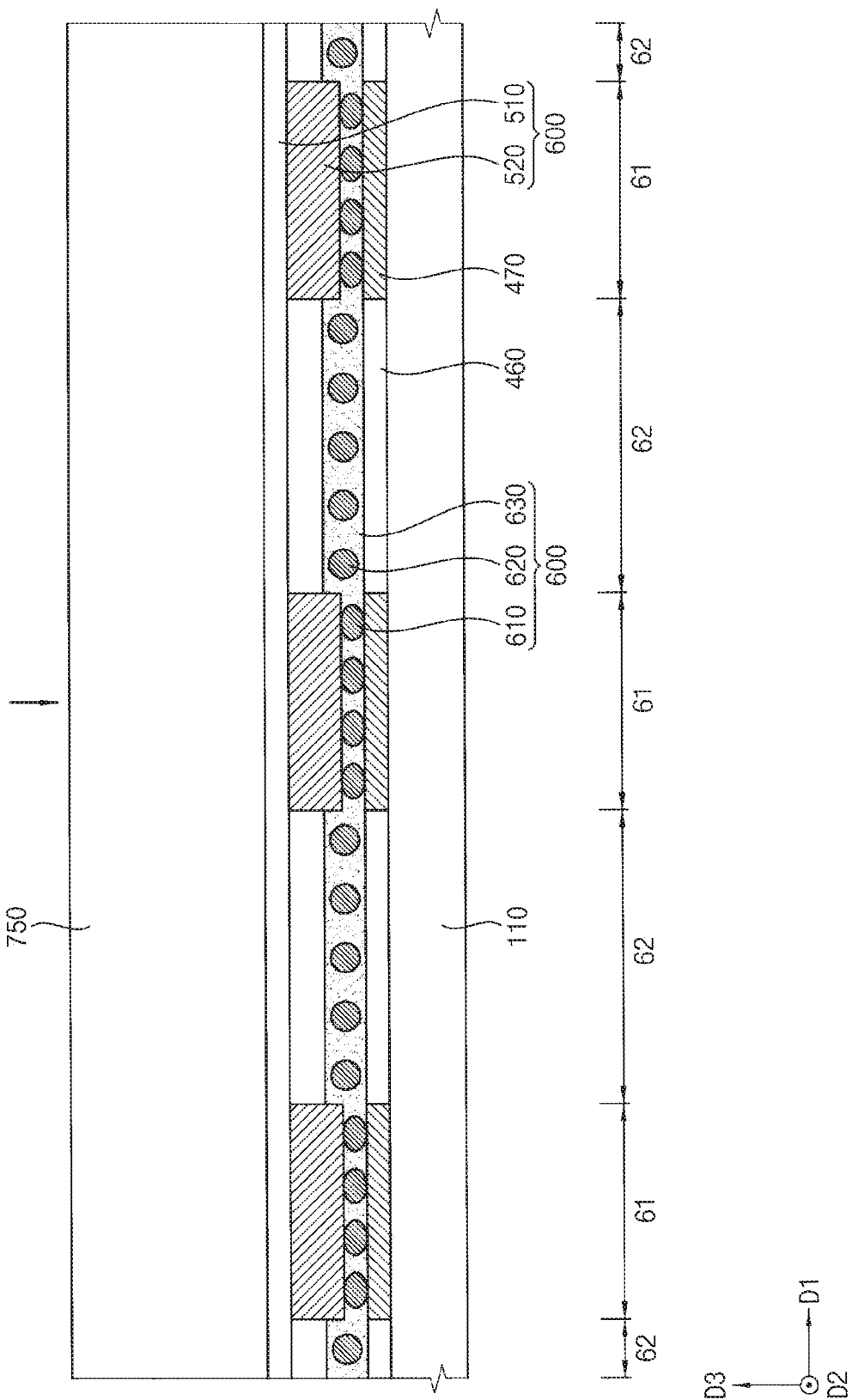
Figure 20:
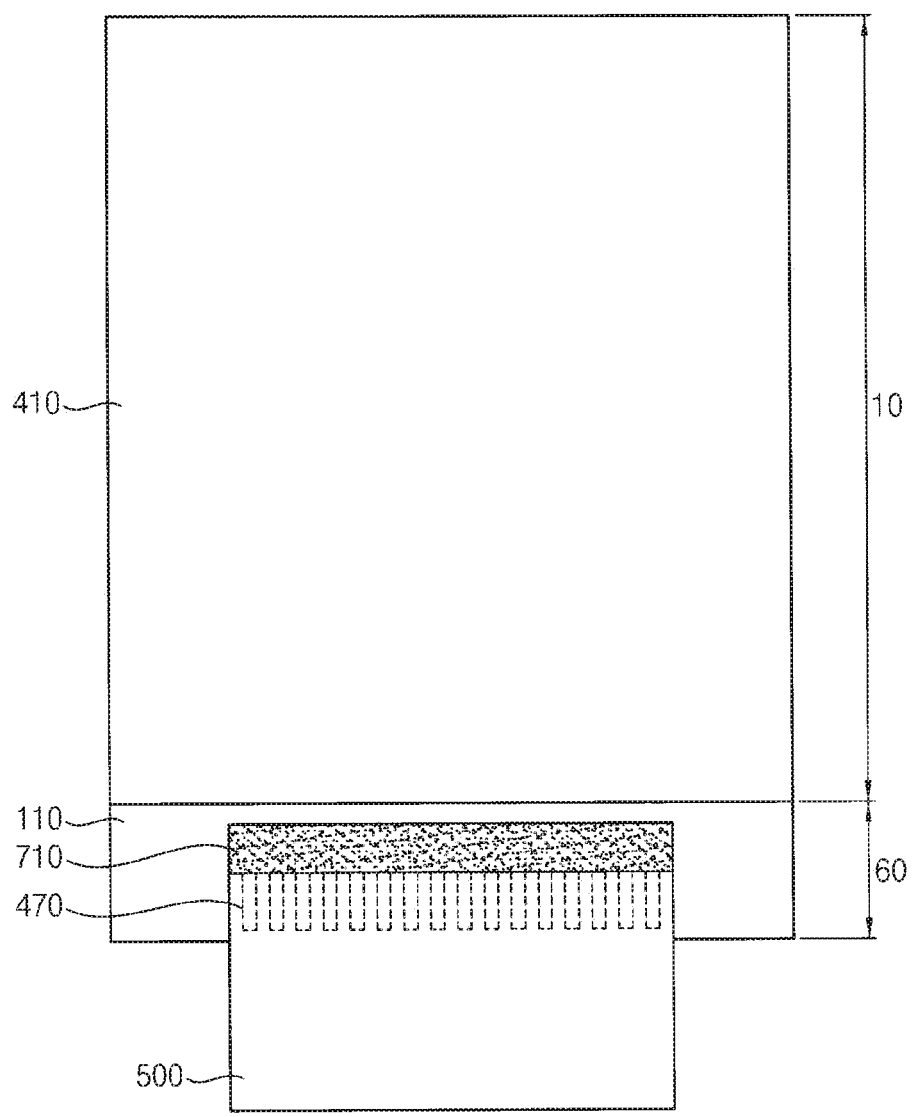

Referring to FIGS. 18 and 19, a heating member 750 may make contact with the top surface of the film package 500. The heating member 750 may be heated to a predetermined temperature, and may apply a pressure to the conductive film member 600 in the direction opposite to the third direction D3. In this case, as intervals between the bump electrodes 520 and the pad electrodes 470 become narrow due to the pressure, a portion of the non-cured resin layer 635 located in the first area 61 may be reflowed into the second area 62, and the non-cured resin layer 635 may be cured by the heat.

After the curing process is performed, the non-cured resin layer 635 is defined as the film layer 630. As the intervals between the bump electrodes 520 and the pad electrodes 470 become narrow, the shapes of the second conductive balls 620 located in the first area 61 between the bump electrodes 520 and the pad electrodes 470 may be deformed from a circular shape into substantially an elliptical shape when viewed from a plan view. In this case, the second conductive balls 620 located in the first area 61 and having substantially the elliptical shape when viewed from a plan view are defined as the first conductive balls 610. In addition, at least a portion of each of the first conductive balls 610 may be exposed from the film layer 630 in the first area 61, and the exposed portion of each of the first conductive balls 610 may make direct contact with the bump electrodes 520 or the pad electrodes 470.

Accordingly, a thickness of the film layer 630 in the first area 61 may be different from a thickness of the film layer 630 in the second area 62. For example, the film layer 630 may have a first thickness in the first area 61, and may have a second thickness greater than the first thickness in the second area 62. In addition, the film layer 630 may cover the second conductive balls 620 in the second area 62. Moreover, since a relatively small amount of the non-cured resin layer 635 is reflowed, the first conductive balls 610 and the second conductive balls 620 may not overlap each other in the third direction D3 in the first and second areas 61 and 62, and the top surface of the film layer 630 may be spaced apart from the bottom surface of the base substrate 510 in the second area 62. In particular, an empty space may be defined by the top surface of the film layer 630, the both side surfaces of each of the bump electrodes 520, and the bottom surface of the base substrate 510 in the second area 62. In some exemplary embodiments, a relatively large amount of the film layer 630 located in the first area 61 may be reflowed, so that the film layer 630 may contact with a portion of the bottom surface of the base substrate 510. In addition, when the heating member 750 applies a relatively large pressure in the direction opposite to the third direction D3, the diameter of each of the first conductive balls 610 in the third direction D3 may be relatively reduced, or the first conductive balls 610 may penetrate each of the pad electrodes 470, so that the shape of the pad electrodes 470 may be deformed.

After the film layer 630 is formed, the heating member 750 may be removed from the top surface of the film package 500.

Referring to FIG. 20, a resin 710 may be disposed in a portion of the pad area 60 on the insulating layer 460. The resin 710 may have a second viscosity less than the first viscosity. In particular, the resin 710 may be located on a side of the conductive film member 600 adjacent to the sealing member 450, a side of the film package 500, a portion of a side surface of the base substrate 510, and the like. The resin 710 may include a thermosetting resin or a photocurable resin. In the illustrated exemplary embodiment, the resin 710 may include a photocurable resin. For example, the resin 710 may include an acryl resin, an epoxy resin, an epoxy acrylate resin, a polyester acrylate resin, a polyester urethane acrylate oligomer resin, a urethane acrylate resin, a urethane acrylate oligomer resin, a polybutadiene acrylate resin, a silicon acrylate resin, an alkyl acrylate resin, a vinyl phenol resin, a bismaleimide resin, a diallyl phthalate resin, etc.

Referring to FIGS. 6, 7 and 21, the resin 710 may penetrate into the empty space through a capillary phenomenon, and may be located in the second area 62. The resin 710 may be irradiated with ultraviolet (UV) light, laser light, visible light, or the like so as to be cured. The cured resin 710 may be defined as the adhesive member 710. For example, the adhesive member 710 may make direct contact with the top surface of the film layer 630, the both side surfaces of each of the bump electrodes 520, and the bottom surface of the base substrate 510.

Accordingly, the display device 700 shown in FIGS. 6 and 7 may be manufactured.

In the method of manufacturing the display device according to the exemplary embodiments, since the non-cured resin layer 635 is used, when the film package 500 applies the pressure to the conductive film member 600 in the direction opposite to the third direction D3, the non-cured resin layer 635 located in the first area 61 may be reflowed into the second area 62, so that the non-cured resin layer 635 may expose at least a portion of each of the first conductive balls 610 located in the first area 61, which may cause the bump electrodes 520 and the pad electrodes 470 to easily contact the first conductive balls 610 directly. In this case, since a relatively small amount of the non-cured resin layer 635 is reflowed in the first area 61, the first conductive balls 610 may not be moved, and a density of the first conductive balls 610 may be relatively uniform in the first area 61. In addition, since a relatively small amount of the non-cured resin layer 635 is reflowed from the first area 61 to the second area 62, the second conductive balls 620 may be not moved, and a density of the second conductive balls 620 may be uniform in the second area 62.

Accordingly, adjacent pad electrodes 470 or the adjacent bump electrodes 520 may not be short-circuited by the second conductive balls 620, and the pad electrode 470 and the bump electrode 520, which overlap each other, may be easily and electrically connected to each other. In addition, since the adhesive member 710 is disposed in the empty space, the film package 500 and the conductive film member 600 may be firmly adhered to each other.

The inventive concepts may be applied to various display devices, such as a vehicle-display device, a ship-display device, an aircraft-display device, portable communication devices, display devices for display or for information transfer, a medical-display device, etc.

According to the exemplary embodiments, the film package of a display device has a relatively thin thickness, so that adjacent pad electrodes or adjacent bump electrodes may not be short-circuited by the conductive balls, and the pad electrode and the bump electrode that overlap each other may be easily and electrically connected to each other. In addition, since the display device includes the adhesive member, adhesive strength between the film package and the conductive film member may be relatively increased.

In the method of manufacturing the display device according to exemplary embodiments, since the non-cured resin layer is used, when the film package applies the pressure to the conductive film member in the direction opposite to the third direction, the non-cured resin layer disposed in the first area may be reflowed into the second area, such that the non-cured resin layer may expose at least a portion of each of the first conductive balls disposed in the first area, and the bump electrodes and the pad electrodes may easily make direct contact with the first conductive balls. In this case, since a relatively small amount of the non-cured resin layer is reflowed in the first area, the first conductive balls may not be moved, and a density of the first conductive balls may be relatively uniform in the first area. In addition, since a relatively small amount of the non-cured resin layer is reflowed from the first area to the second area, the second conductive balls may not be moved, and a density of the second conductive balls may be uniform in the second area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a lower substrate having a display area and a pad area;
   a display structure disposed in the display area of the lower substrate;
   an upper substrate disposed on the display structure in the display area, and facing the lower substrate;
   pad electrodes disposed in the pad area of the lower substrate and spaced apart from each other in a first direction parallel to a top surface of the lower substrate;
   a conductive film member including conductive balls disposed on the pad electrodes, the conductive film member having a first area overlapping the pad electrodes and a second area not overlapping the pad electrodes; and
   a film package disposed on the conductive film member and including bump electrodes overlapping the first area of the conductive film member,
   wherein:
   the shape of the conductive balls disposed in the first area is different from those disposed in the second area;
   the conductive balls are arranged in the first direction and a second direction orthogonal to the first direction; and
   each of the conductive balls do not overlap one another in a third direction perpendicular to the first and second directions.

2. The display device of claim 1, wherein adjacent conductive balls are spaced apart from each other at equidistant intervals.

3. The display device of claim 2, wherein:
   the conductive balls include:
      first conductive balls disposed in the first area; and
      second conductive balls disposed in the second area; and
   a diameter of each of the first conductive balls in the third direction perpendicular to the first and second directions is less than a diameter of each of the second conductive balls in the third direction.

4. The display device of claim 3, wherein a portion of each of the first conductive balls directly contacts at least one of the pad electrode and the bump electrode.

5. The display device of claim 1, wherein the conductive film member further includes a film layer partially covering the conductive balls.

6. The display device of claim 5, wherein a thickness of the film layer disposed in the first area is different from a thickness of the film layer disposed in the second area.

7. The display device of claim 5, wherein:
   the film layer disposed in the first area has a first thickness and exposes at least a portion of each of the conductive balls disposed in the first area; and
   the film layer disposed in the second area has a second thickness greater than the first thickness and covers the conductive balls disposed in the second area.

8. The display device of claim 1, wherein the film package further includes a base substrate disposed on the bump electrodes.

9. The display device of claim 8, wherein:
   the conductive film member electrically connects the film package and the pad electrodes disposed in the first area; and
   a top surface of the conductive film member disposed in the second area is spaced apart from a bottom surface of the base substrate.

10. The display device of claim 1, further comprising an adhesive member disposed between the conductive film member and the film package disposed in the second area.

11. The display device of claim 1, further comprising an insulating layer disposed between the pad electrodes in the pad area of the lower substrate,
    wherein a height of the insulating layer in the third direction is substantially the same as that of the pad electrodes.

* * * * *